US012652914B2

(12) United States Patent
Tabatake et al.

(10) Patent No.: US 12,652,914 B2
(45) Date of Patent: Jun. 9, 2026

(54) DISPLAY DEVICE AND SUBSTRATE

(71) Applicant: Magnolia White Corporation, Tokyo (JP)

(72) Inventors: Hiroshi Tabatake, Tokyo (JP); Hideyuki Takahashi, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 415 days.

(21) Appl. No.: 18/491,902

(22) Filed: Oct. 23, 2023

(65) Prior Publication Data

US 2024/0138217 A1 Apr. 25, 2024
US 2024/0237443 A9 Jul. 11, 2024

(30) Foreign Application Priority Data

Oct. 24, 2022 (JP) ................................. 2022-169652

(51) Int. Cl.
  *H10K 59/131* (2023.01)
  *G06F 3/041* (2006.01)
  *H10K 59/40* (2023.01)
(52) U.S. Cl.
  CPC ......... *H10K 59/131* (2023.02); *G06F 3/0412* (2013.01); *G06F 3/04164* (2019.05); *H10K 59/40* (2023.02)

(58) Field of Classification Search
  CPC .... H10K 59/131; H10K 59/40; G06F 3/0412; G06F 3/04164; G06F 3/0443; G06F 3/0446; G06F 3/041; G06F 3/044; G06F 2203/04111; G06F 2203/04112; G02F 1/13338; G09F 9/335; G09F 9/35
  See application file for complete search history.

(56) References Cited

U.S. PATENT DOCUMENTS

2010/0085326 A1* 4/2010 Anno ................. H03K 17/9622
                                                    345/174
2020/0409487 A1 12/2020 Matsumoto et al.

FOREIGN PATENT DOCUMENTS

JP        2019-159003 A      9/2019

* cited by examiner

*Primary Examiner* — Herve-Louis Y Assouman
(74) *Attorney, Agent, or Firm* — XSENSUS LLP

(57) ABSTRACT

According to one embodiment, a display device includes touch electrodes overlapping a display area, first wiring lines connected to the touch electrodes, second wiring lines connected to the first wiring lines, third wiring lines connected to the second wiring lines, third wiring lines connected to the third wiring lines, fourth wiring lines connected to the third wiring lines, and the fifth wiring lines connected to the fourth wiring lines, wherein the second wiring lines are partially exposed, the exposed regions of the second wiring lines constitute connecting portions with a circuit board, and half of the fourth wiring lines and all of the fifth wiring lines extend to an end portion of a base.

13 Claims, 17 Drawing Sheets

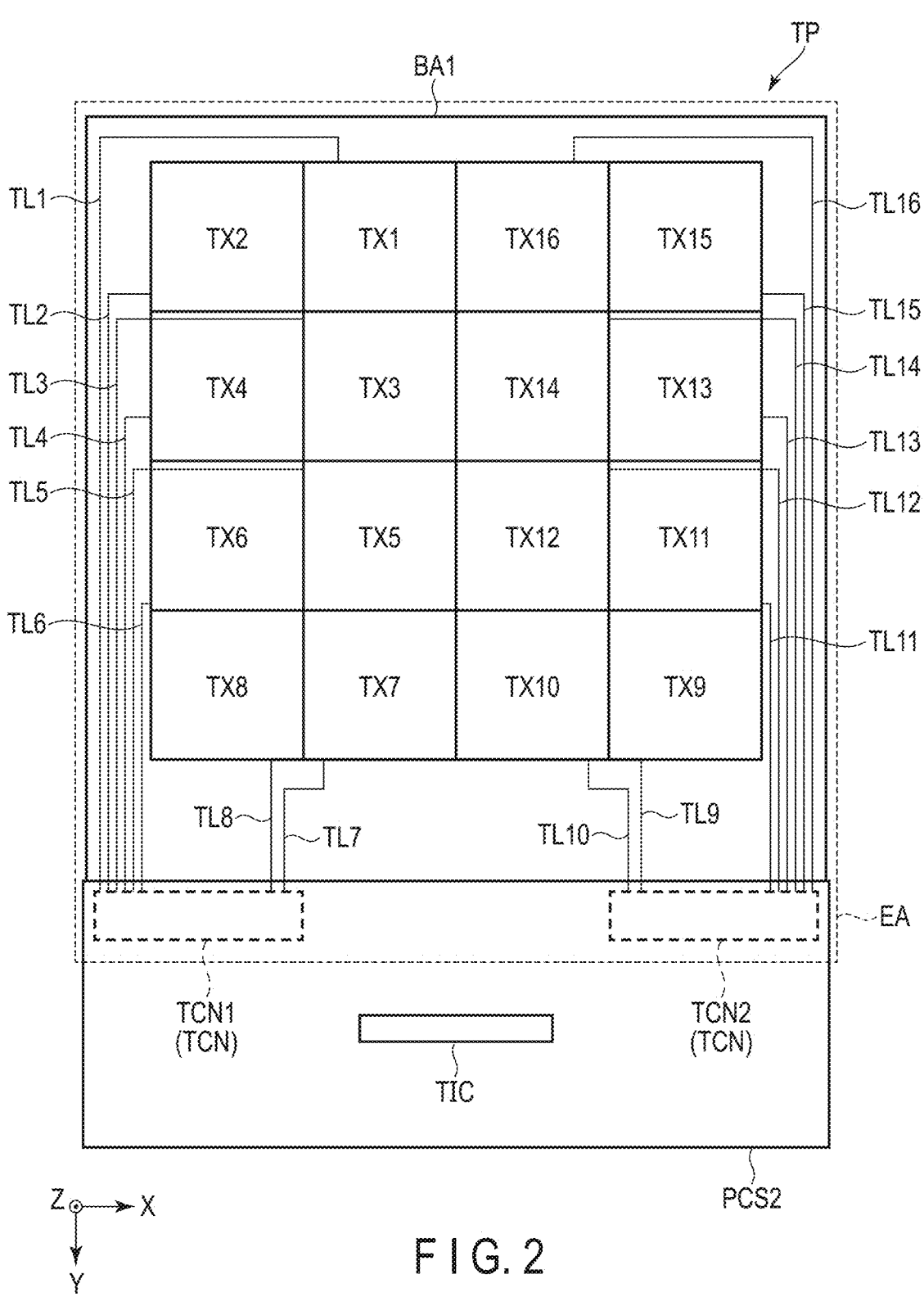
F I G. 2

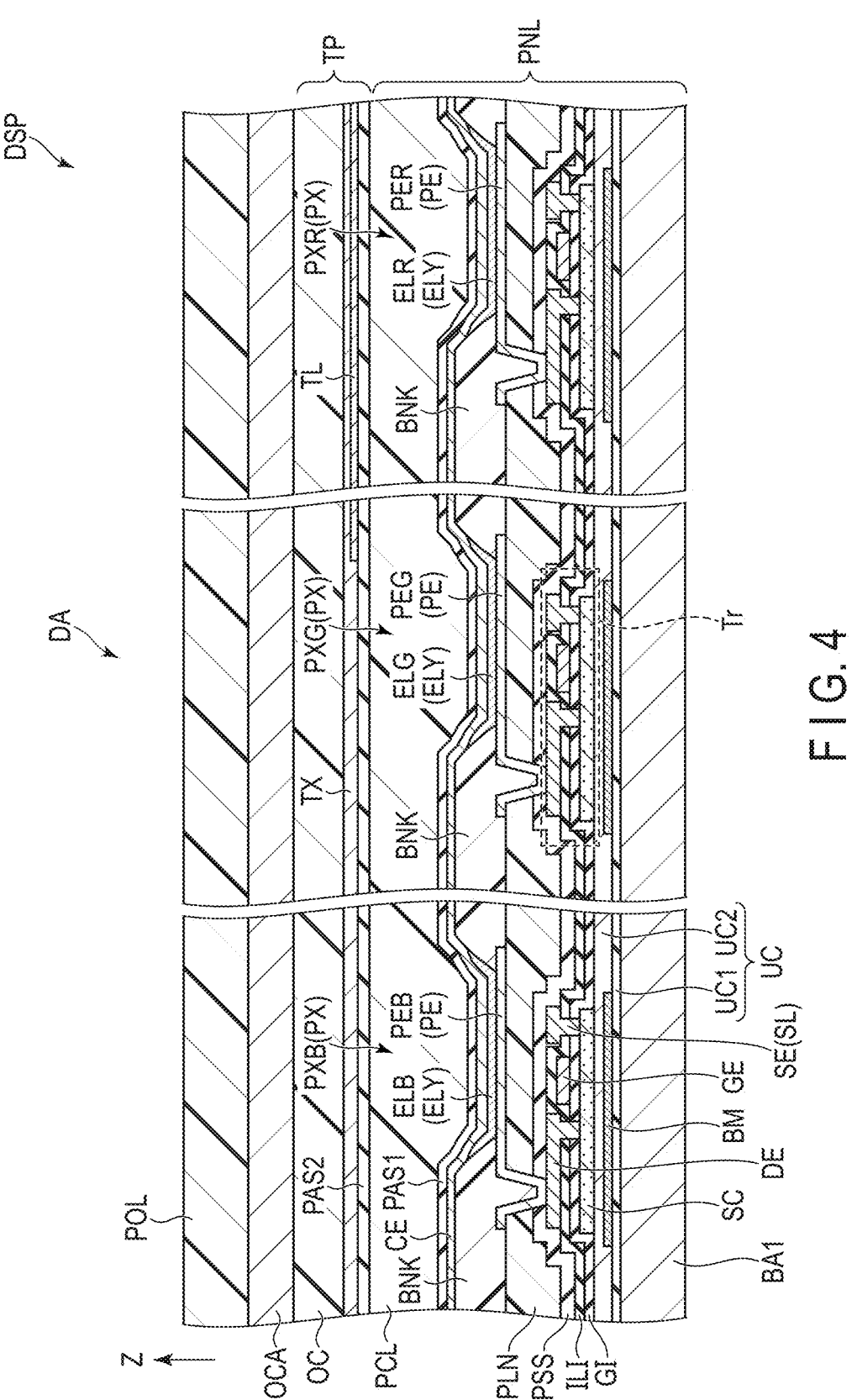
F I G. 4

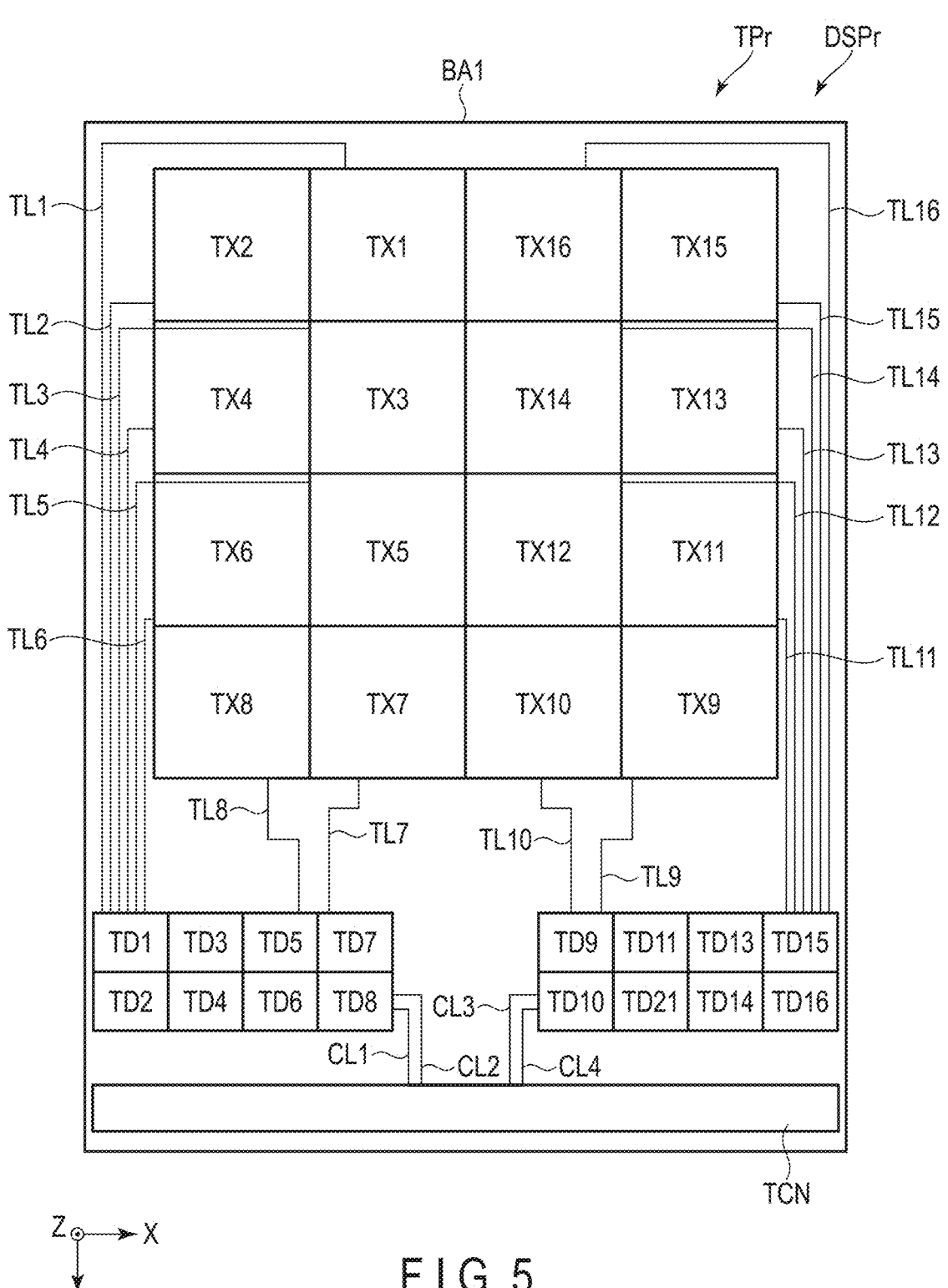
F I G. 5

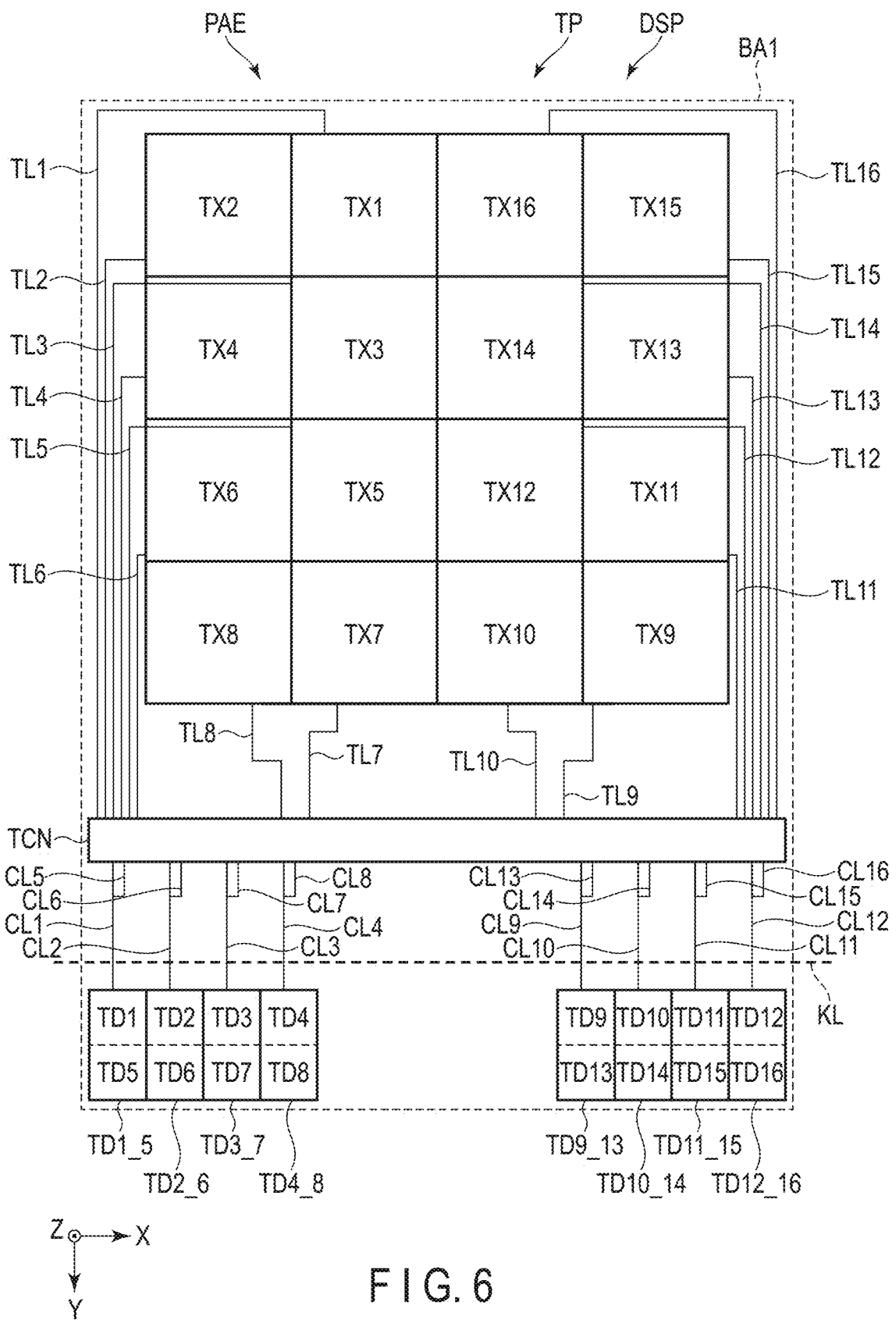
F I G. 6

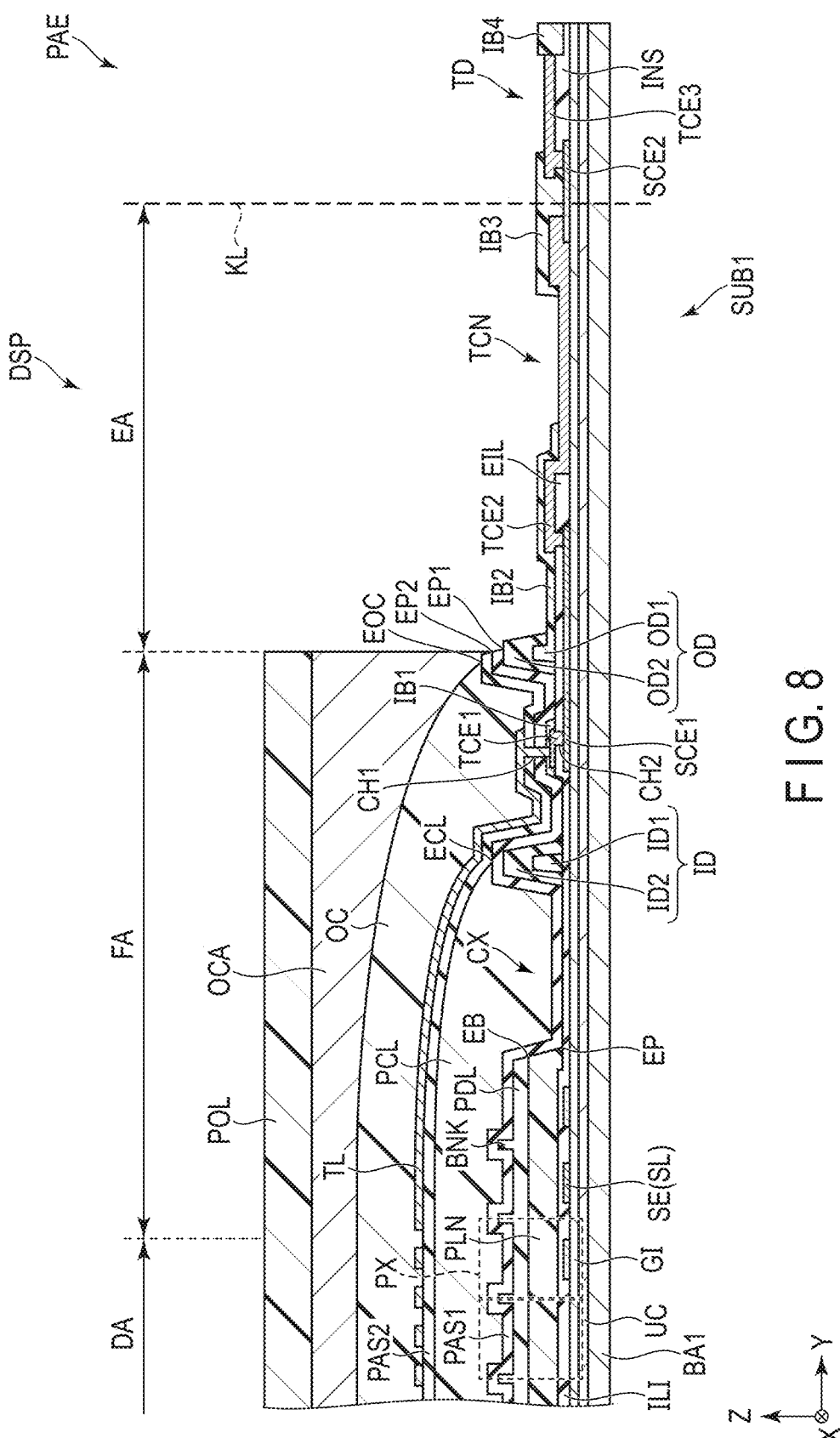
F I G. 8

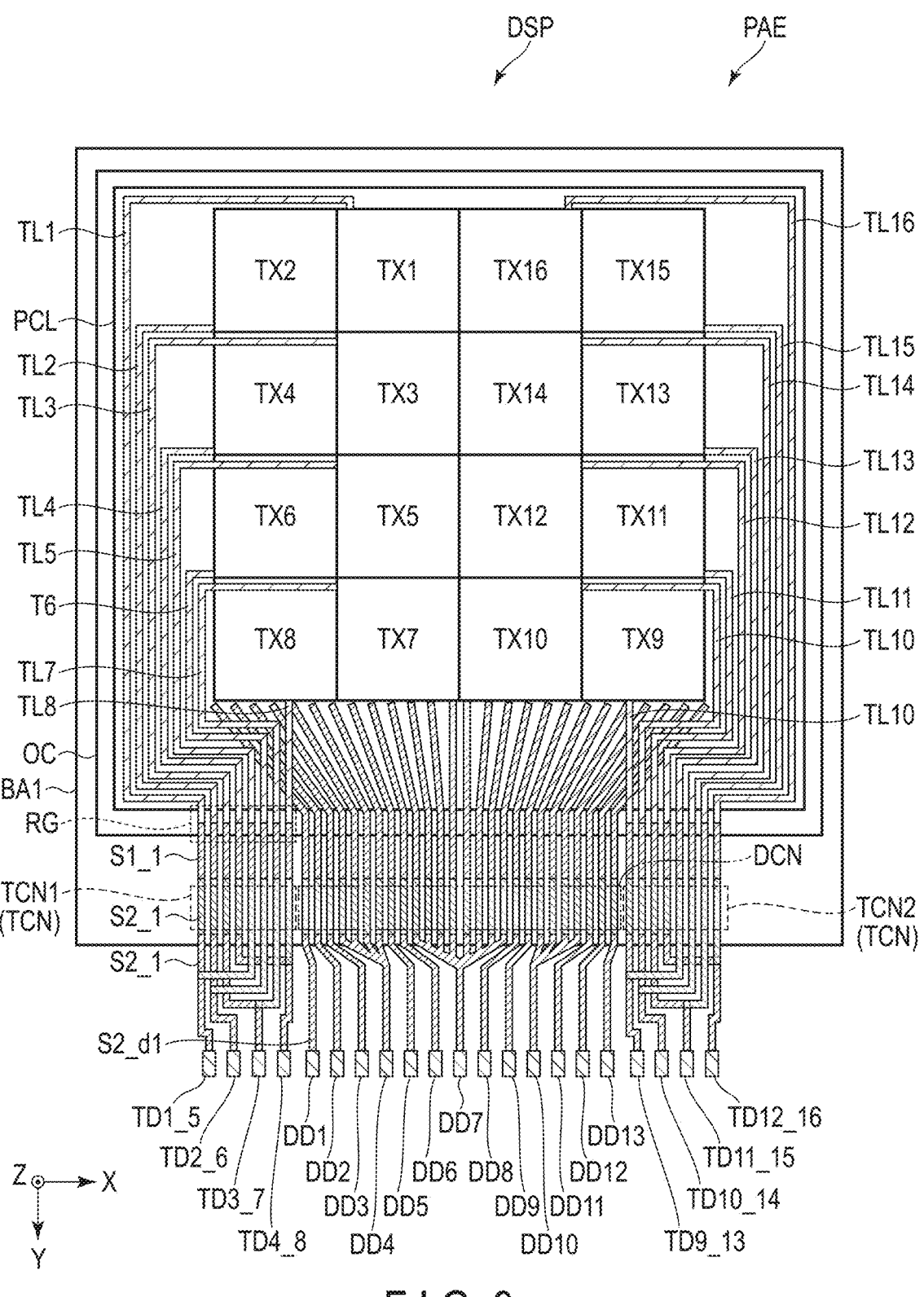
F I G. 9

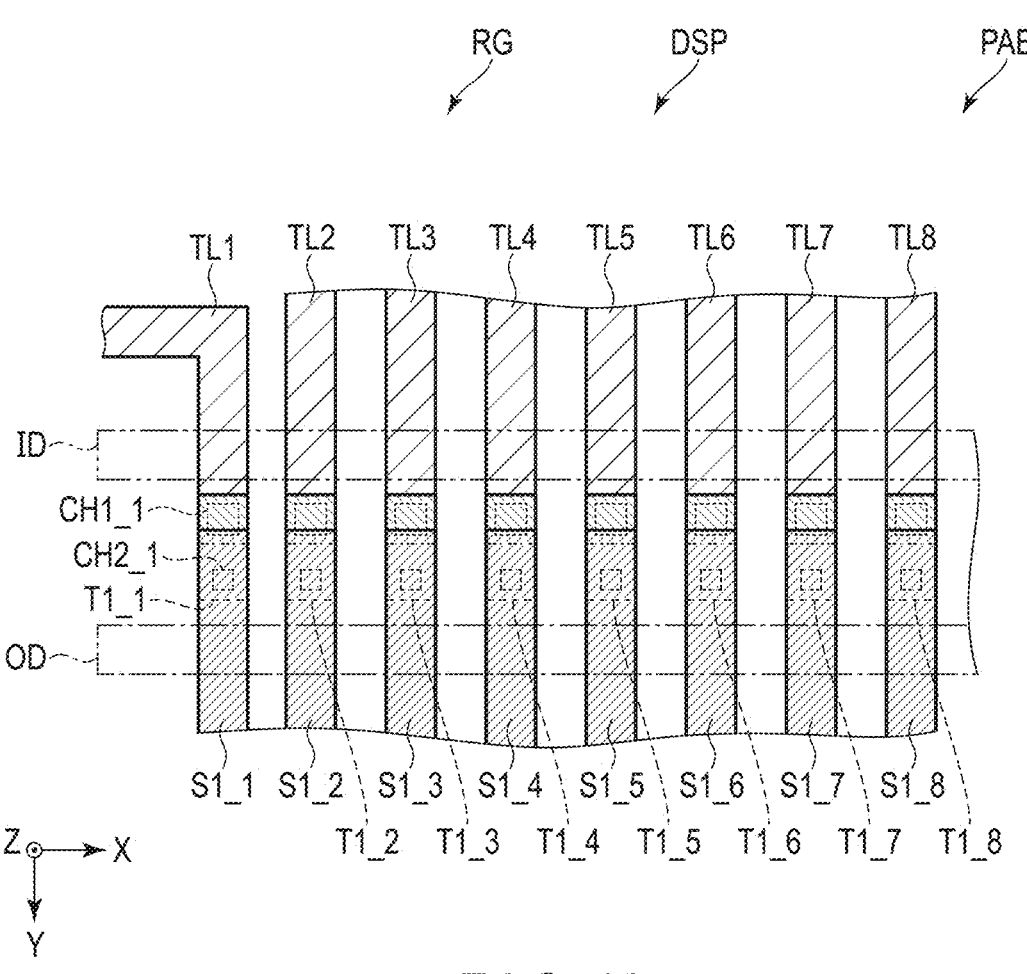
F I G. 10

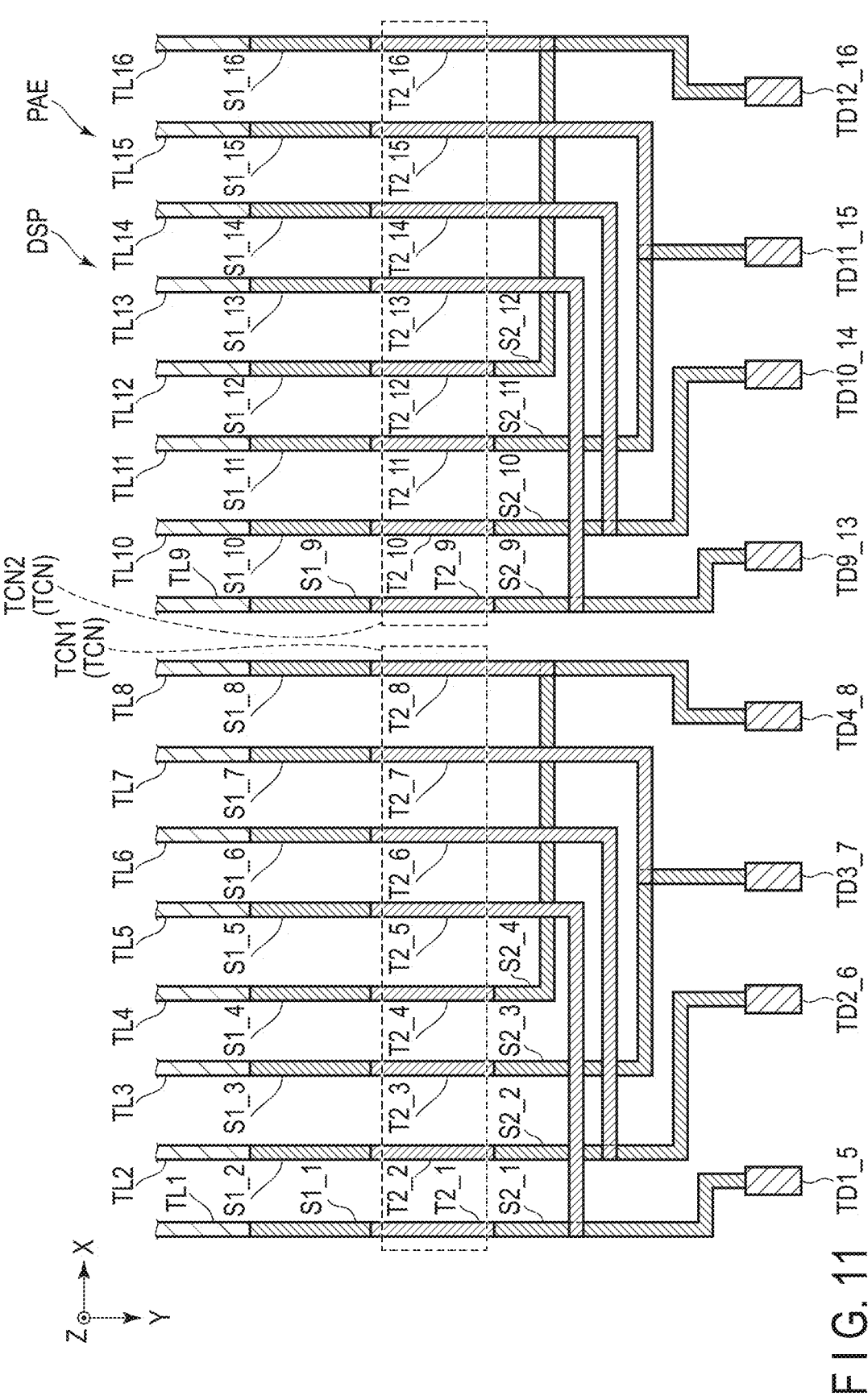
F I G. 11

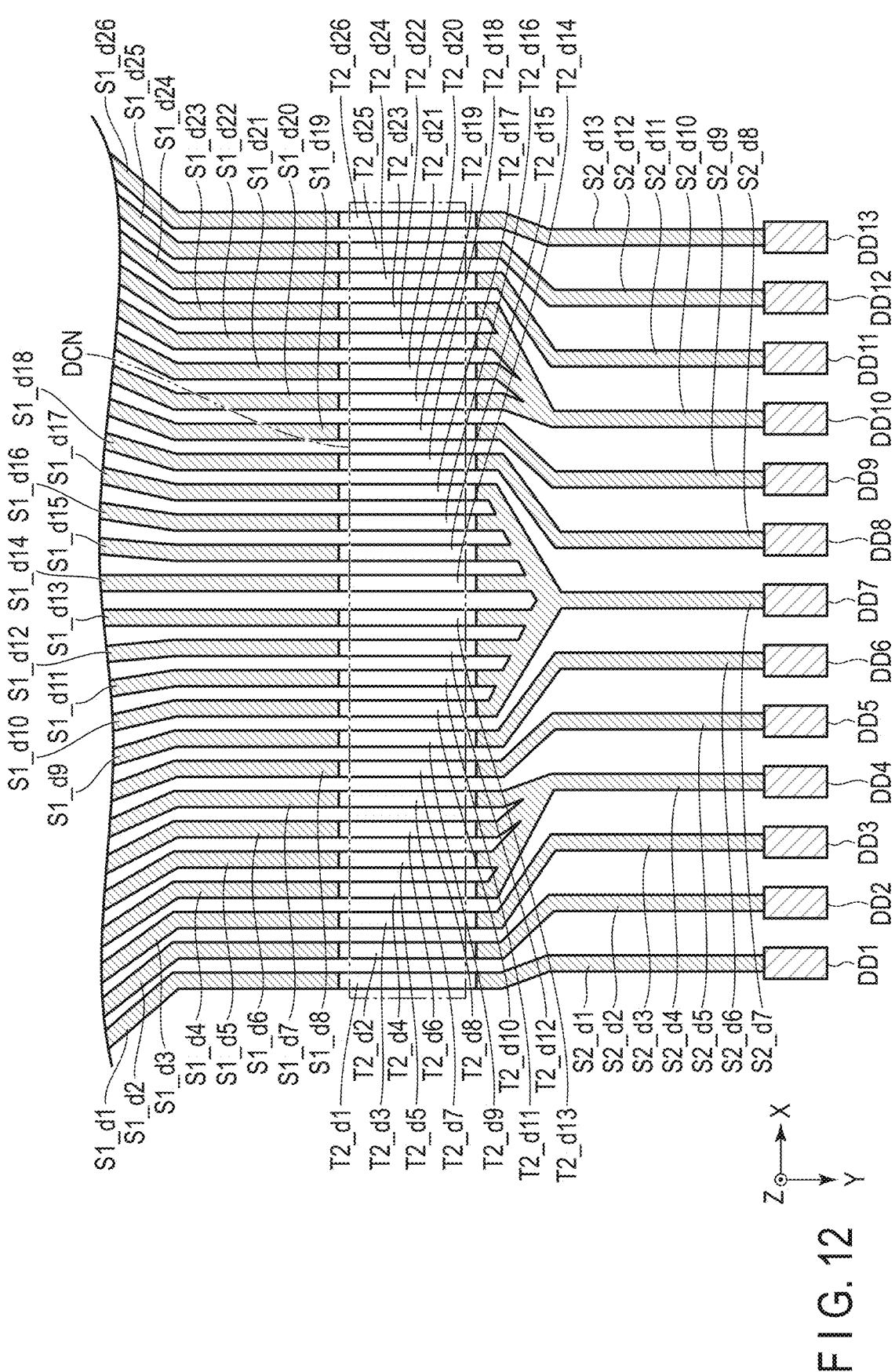
F I G. 12

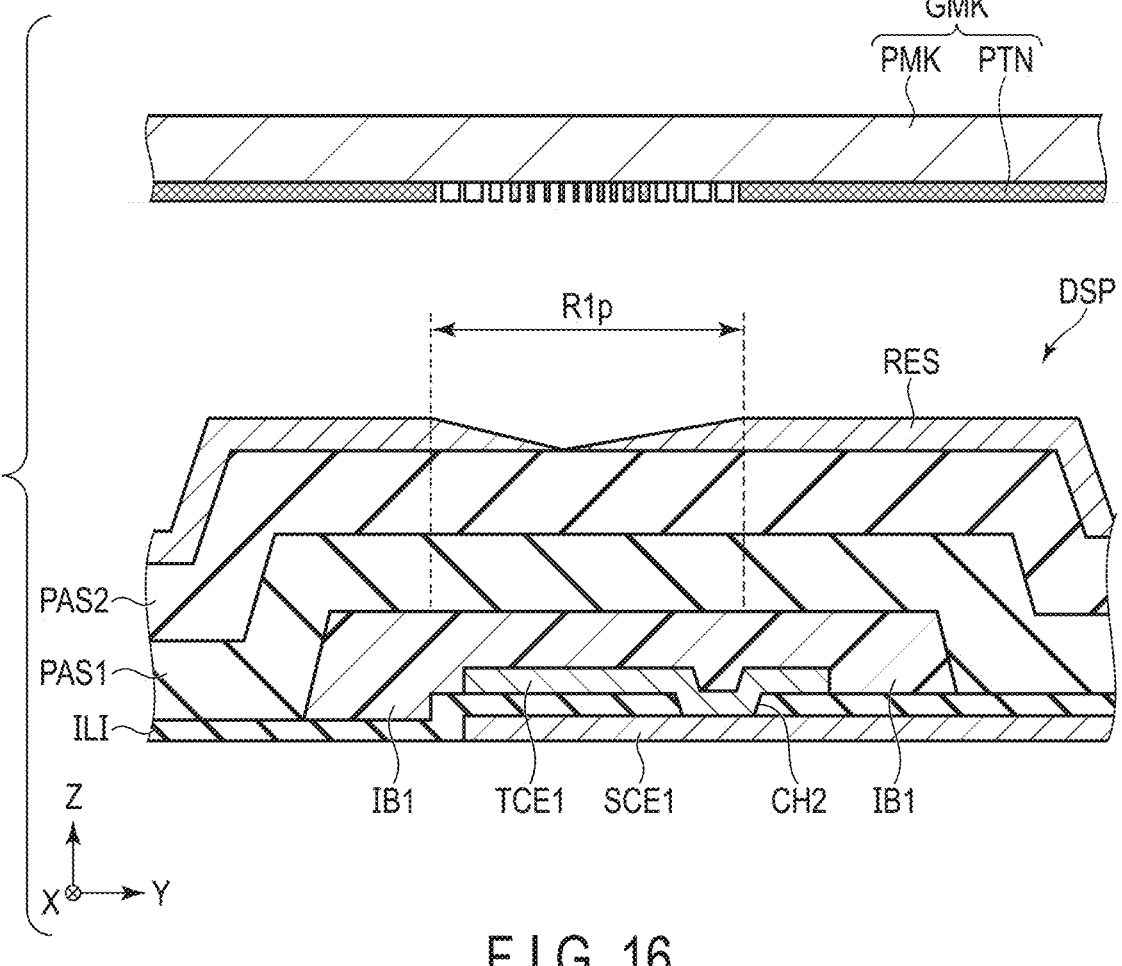
F I G. 16

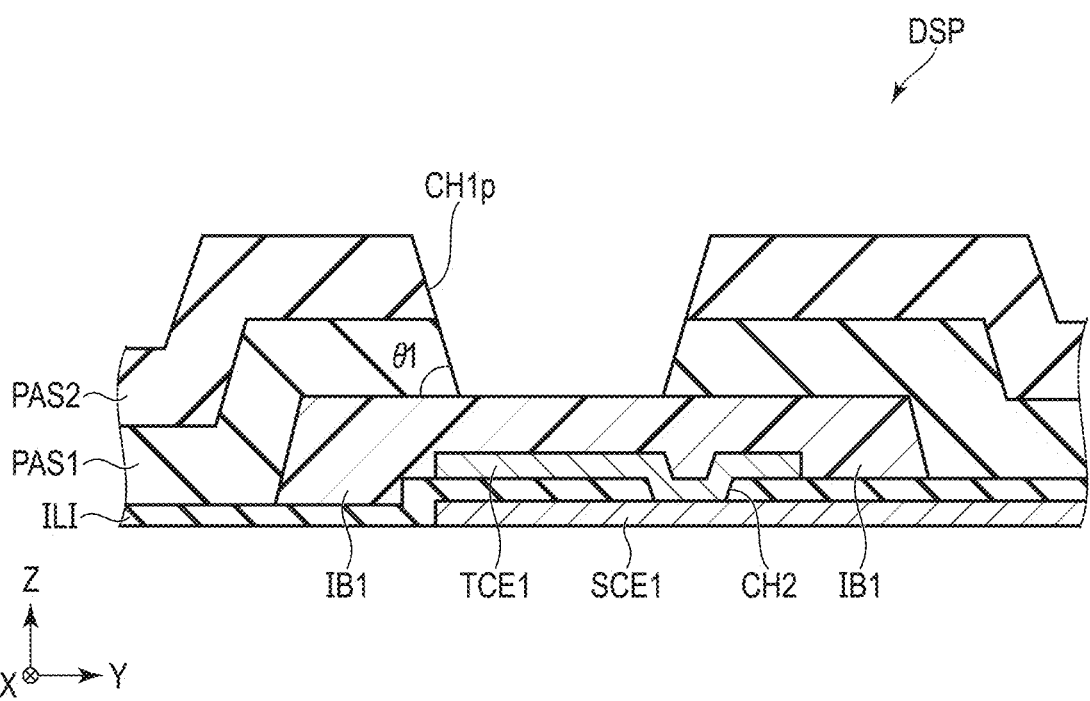
F I G. 17

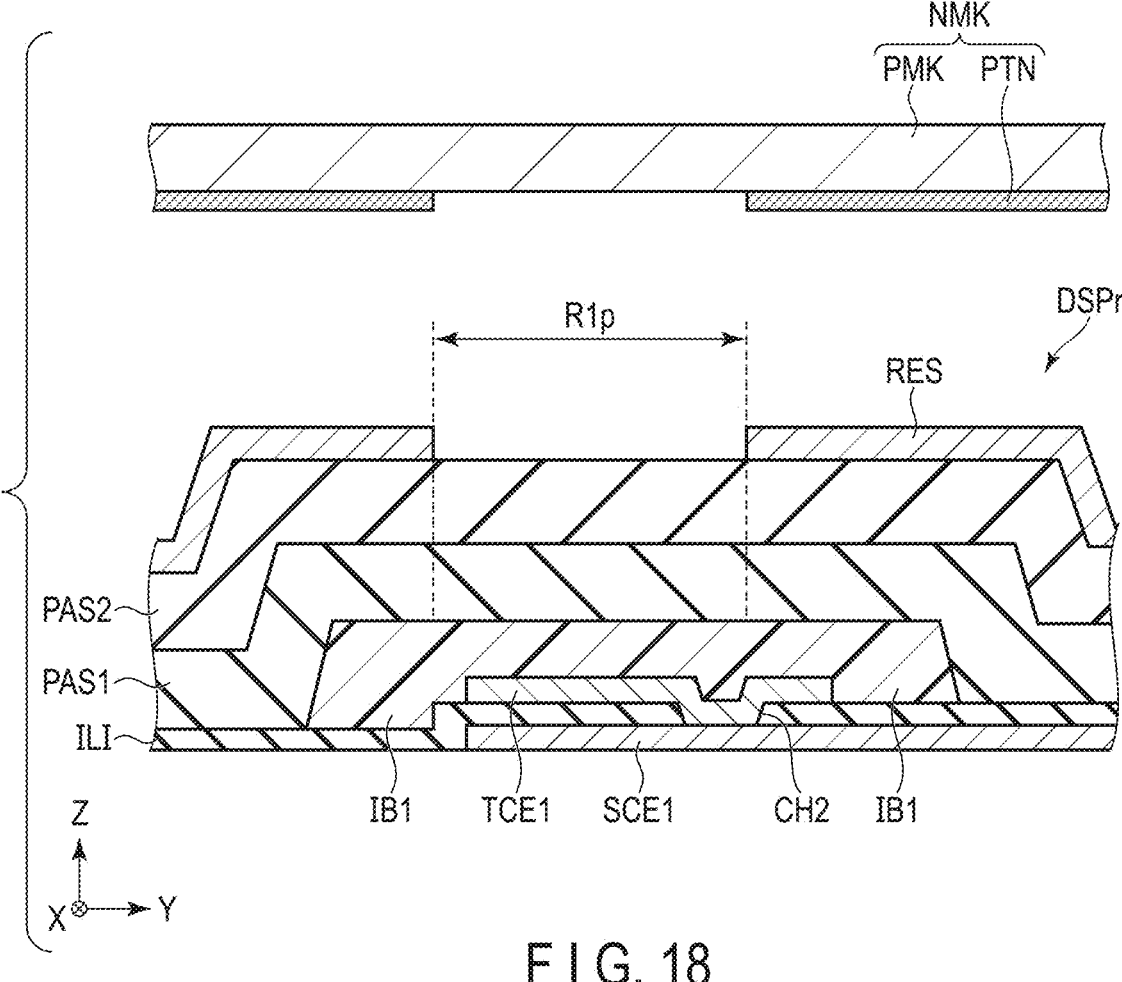
F I G. 18

DISPLAY DEVICE AND SUBSTRATE

CROSS-REFERENCE TO RELATED APPLICATIONS

This application is based upon and claims the benefit of priority from Japanese Patent Application No. 2022-169652 filed Oct. 24, 2022, the entire contents of which are incorporated herein by reference.

FIELD

Embodiments described herein relate generally to a display device and a substrate.

BACKGROUND

Touch-panel display devices such as organic electroluminescence (EL) display devices with touch panels and liquid crystal display devices with touch panels have been developed. In such touch panel-equipped display devices, the touch panel is overlaid on the display screen in order to impart a touch sensor function to detect location information on the display screen.

BRIEF DESCRIPTION OF THE DRAWINGS

FIG. 2 is a plan view schematically showing a configuration example of a touch panel according to Embodiment 1.

FIG. 4 is a cross-sectional view schematically showing a configuration example of the display device according to Embodiment 1.

FIG. 5 is a plan view showing a display device of a comparative example.

FIG. 6 is a plan view schematically showing a configuration example of individual elements of Embodiment 1.

FIG. 8 is a cross-sectional view schematically showing a configuration example of the individual elements in Embodiment 1.

FIG. 9 is a plan view schematically showing a configuration example of the individual elements in Embodiment 1.

FIG. 10 is a partial enlarged view of the part enclosed by dotted lines in FIG. 9.

FIG. 11 is a plan view showing inspection pads and wiring lines connected thereto.

FIG. 12 is a plan view showing wiring lines which connect signal lines connected to pixels to inspection pads for display.

FIG. 16 is a cross-sectional view showing the method of manufacturing the display device in Embodiment 2.

FIG. 17 is a cross-sectional view showing the method of manufacturing the display device in Embodiment 2.

FIG. 18 is a cross-sectional view showing a method of manufacturing the display device according to a comparative example.

DETAILED DESCRIPTION

Figure 1:
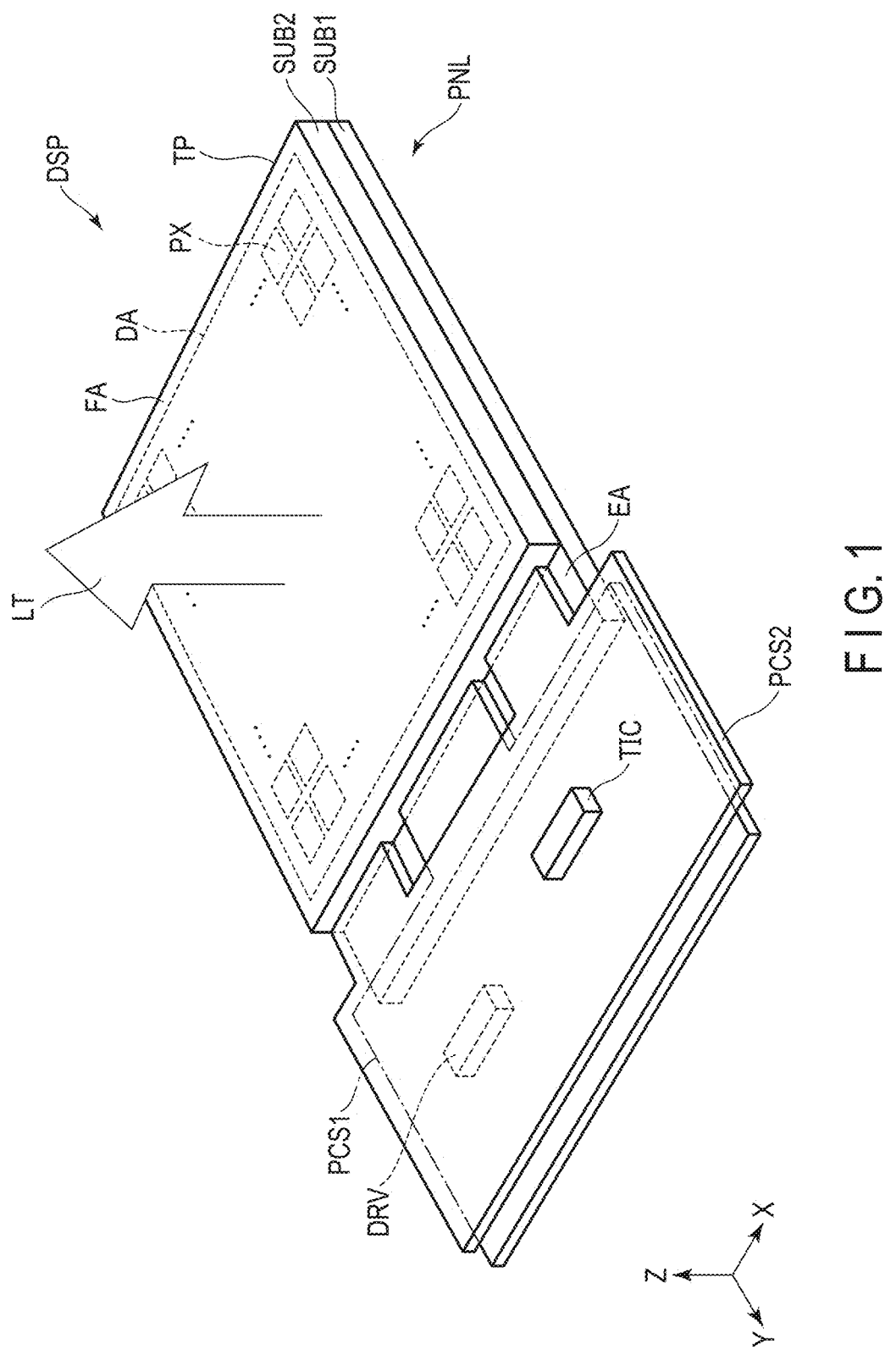
FIG. 1 is a perspective view schematically showing a configuration example of a display device according to Embodiment 1.

In general, according to one embodiment, a display device comprises
a base;
a display area in which a plurality of pixels are provided;
a plurality of touch electrodes which overlap the display area;
a plurality of first wiring lines connected to the plurality of touch electrodes, respectively;
a plurality of second wiring lines connected to the plurality of first wiring lines, respectively;
a plurality of third wiring lines connected to the plurality of second wiring lines, respectively;
a plurality of fourth wiring lines connected to the plurality of third wiring lines, respectively;
a plurality of fifth wiring lines connected to the plurality of fourth wiring lines, respectively; and
a plurality of fifth wiring lines connected to the plurality of fourth wiring lines, respectively; wherein
the plurality of second wiring lines are each partially exposed,
the exposed regions of the plurality of second wiring lines constitute connecting portions with a wiring substrate,
half of the plurality of fourth wiring lines and all of the plurality of fifth wiring lines extend to an end portion of the base.
According to one embodiment, a substrate comprises a plurality of individual elements,
the plurality of individual elements each comprising:
a display area in which a plurality of pixels are provided,
a plurality of touch electrodes which overlap the display area; and
a plurality of wiring lines connected to the plurality of touch electrodes, respectively,
wherein
the plurality of wiring lines are each partially exposed,
the exposed regions of the plurality of wiring lines constitute connecting portions with a wiring substrate,
the substrate further comprises a plurality of inspection pads connected to the plurality of wiring lines,
cutting lines are set between the plurality of inspection pads and the connecting portions, and
the plurality of individual elements are each cut out at the cutting lines to form a display device.
An object of this embodiment is to provide a display device comprising a touch panel with a narrow frame.
Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a display device with reference to the drawings.

In this embodiment, a first direction X, a second direction Y and a third direction Z are orthogonal to each other, but may intersect at an angle other than 90 degrees. The direction toward the tip of the arrow in the third direction Z is defined as up or above, and the direction opposite to the direction toward the tip of the arrow in the third direction Z is defined as down or below. Note that the first direction X, the second direction Y and the third direction Z may as well be referred to as an X direction, a Y direction and a Z direction, respectively.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the optical control element on a tip side of the arrow in the third direction Z. Here, viewing from this observation position toward the X-Y plane defined by the first direction X and the second direction Y is referred to as plan view. Viewing a cross-section of the display device in the X-Z plane defined by the first direction X and the third direction Z or in the Y-Z plane defined by the second direction Y and the third direction Z is referred to as cross-sectional view.

Embodiment 1

FIG. 1 is a perspective view schematically showing a configuration example of a display device of Embodiment 1. A display device DSP comprises a display panel PNL and a touch panel TP. In the display panel PNL, a display area DA and a frame area FA provided around the display area DA are provided on a substrate SUB1. The display device DSP includes a plurality of pixels PX disposed in the display area DA. In the display device DSP, light LT from the rear surface is transmitted to the surface and vice versa.

In an area EA of an end portion of the substrate SUB1, a wiring substrate PCS1 is provided. The wiring substrate PCS1 is provided with a drive element DRV which outputs video signals and drive signals. Signals from the drive element DRV are input to pixels PX in the display area DA via the wiring substrate PCS1. Based on the video signals and various types of control signals, the pixels PX emits light.

The touch panel TP is disposed on the display area DA of the display panel PNL to overlap. As will be described in detail later, the touch panel TP includes a plurality of touch electrodes. The touch electrodes are connected to a wiring substrate PCS2 via wiring lines. The wiring substrate PCS2 is provided with a drive element TIC which outputs touch drive signals.

FIG. 2 is a plan view schematically showing a configuration example of the touch panel of Embodiment 1. The touch panel TP shown in FIG. 2 includes a plurality of touch electrodes TX. In this embodiment, there are sixteen touch electrodes TX provided, but the number of the electrodes is not limited to this. The number of touch electrodes TX can be set arbitrary as needed.

The sixteen touch electrodes TX1 to TX16 are arranged in 4 rows and 4 columns. The touch electrode TX1 is disposed adjacent to the touch electrode TX2 and the touch electrode TX16 along the first direction X. The touch electrode TX1 is disposed adjacent to the touch electrode TX3 along the second direction Y.

The touch electrode TX2 is disposed adjacent to the touch electrode TX1 along the first direction X. The touch electrode TX2 is disposed adjacent to the touch electrode TX4 along the second direction Y.

The touch electrode TX3 is disposed adjacent to the touch electrode TX4 and the touch electrode TX14 along the first direction X. The touch electrode TX3 is disposed adjacent to the touch electrode TX1 and the touch electrode TX5 along the second direction Y.

The touch electrode TX4 is disposed adjacent to the touch electrode TX3 along the first direction X. The touch electrode TX4 is disposed adjacent to the touch electrode TX2 and the touch electrode TX6 along the second direction Y.

The touch electrode TX5 is disposed adjacent to the touch electrode TX6 and the touch electrode TX12 along the first direction X. The touch electrode TX5 is arranged adjacent to the touch electrode TX3 and the touch electrode TX7 along the second direction Y.

The touch electrode TX6 is disposed adjacent to the touch electrode TX5 along the first direction X. The touch electrode TX6 is disposed adjacent to the touch electrode TX4 and the touch electrode TX8 along the second direction Y.

The touch electrode TX7 is disposed adjacent to the touch electrode TX8 and the touch electrode TX10 along the first direction X. The touch electrode TX7 is disposed adjacent to the touch electrode TX5 along the second direction Y.

The touch electrode TX8 is disposed adjacent to touch electrode TX7 along the first direction X. The touch electrode TX8 is disposed adjacent to the touch electrode TX6 along the second direction Y.

The touch electrode TX9 is disposed adjacent to the touch electrode TX10 along the first direction X. The touch electrode TX9 is disposed adjacent to the touch electrode TX11 along the second direction Y.

The touch electrode TX10 is disposed adjacent to the touch electrode TX7 and the touch electrode TX9 along the first direction X. The touch electrode TX10 is disposed adjacent to the touch electrode TX12 along the second direction Y.

The touch electrode TX11 is disposed adjacent to the touch electrode TX12 along the first direction X. The touch electrode TX11 is disposed adjacent to the touch electrode TX9 and the touch electrode TX13 along the second direction Y.

The touch electrode TX12 is disposed adjacent to the touch electrode TX5 and the touch electrode TX11 along the first direction X. The touch electrode TX12 is disposed adjacent to the touch electrode TX10 and the touch electrode TX14 along the second direction Y.

The touch electrode TX13 is disposed adjacent to the touch electrode TX14 along the first direction X. The touch electrode TX13 is disposed adjacent to the touch electrode TX11 and the touch electrode TX15 along the second direction Y.

The touch electrode TX14 is disposed adjacent to the touch electrode TX3 and the touch electrode TX13 along the first direction X. The touch electrode TX14 is disposed adjacent to the touch electrode TX12 and the touch electrode TX16 along the second direction Y.

The touch electrode TX15 is disposed adjacent to the touch electrode TX16 along the first direction X. The touch electrode TX15 is disposed adjacent to the touch electrode TX13 along the second direction Y.

The touch electrode TX16 is disposed adjacent to the touch electrode TX1 and the touch electrode TX15 along the first direction X. The touch electrode TX16 is disposed adjacent to the touch electrode TX14 along the second direction Y.

The arrangement of the touch electrodes TX1 to TX16 is not limited to the one described above, but they may have different arrangements.

To the touch electrodes TX1 to TX16, wiring line TL1 to TL16 are connected, respectively. The wiring line TL1 to TL16 are connected to the wiring substrate PCS2 via connecting portions TCN. More precisely, the wiring line TL1 to TL8 are connected to the wiring substrate PCS2 via a connecting portion TCN1, and the wiring line TL9 to TL16 are connected to the wiring substrate PCS2 via a connecting portion TCN2. When the connecting portion TCN1 and the connecting portion TCN2 are not distinguished from each other, they are simply referred to as connecting portions TCN.

The touch electrodes TX1 to TX16, the wiring line TL1 to TL16 and the connection portions TCN are formed on the base BA1 along the third direction Z while interposing the display area and the frame area of the display panel, which is not shown.

Figure 3:
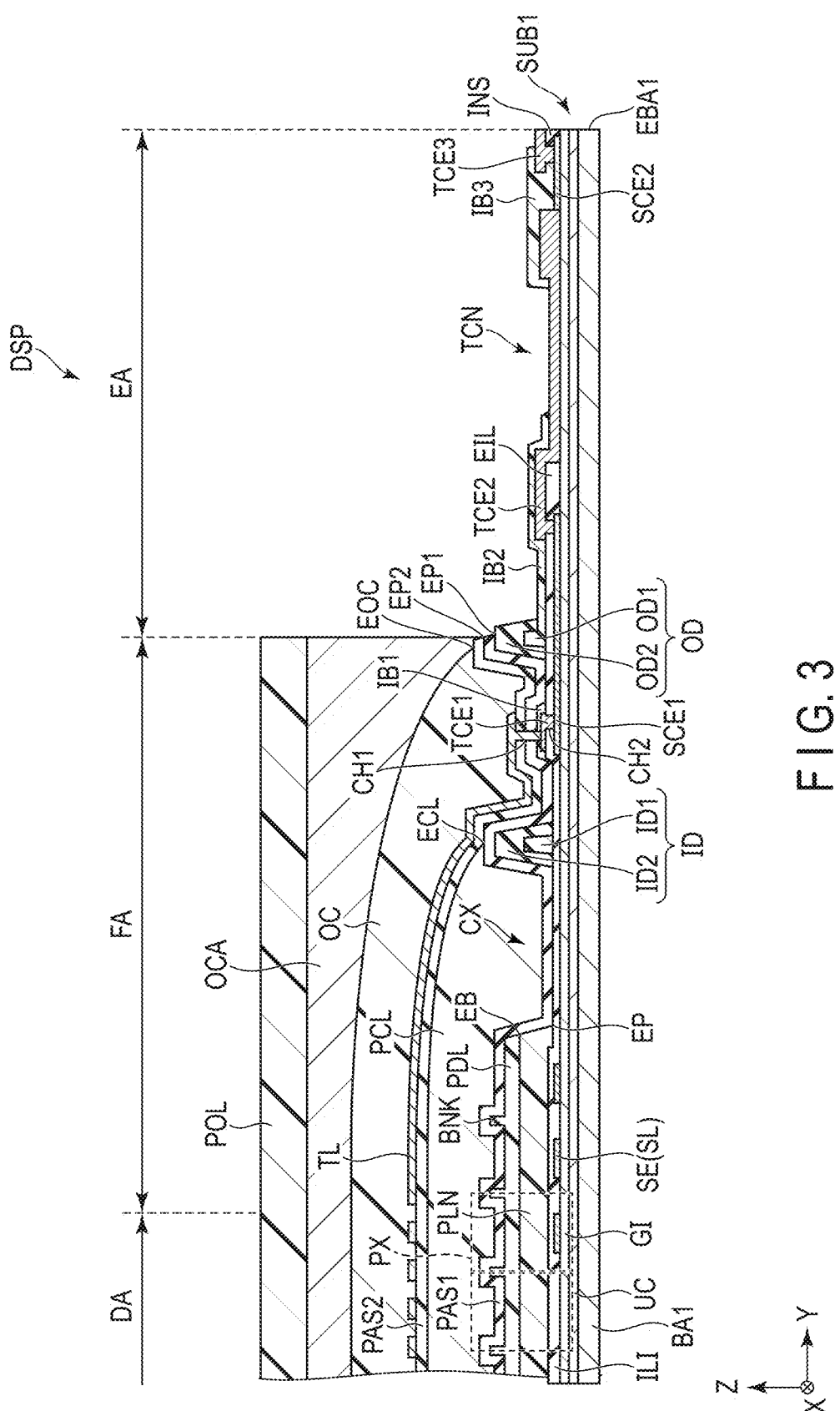
FIG. 3 is a cross-sectional view schematically showing a configuration example of the display device according to Embodiment 1.

FIG. 3 is a cross-sectional view schematically showing a configuration example of the display device of Embodiment 1. The display device DSP shown in FIG. 3 includes an insulating layer UC, an insulating layer GI and an insulating layer ILI on a base BA1. The insulating layer UC, the insulating layer GI and the insulating layer ILI are stacked one on another in this order along the third direction Z.

The base BA1 is, for example, a glass or a base constituted by a resin material. As the resin material, for example, acrylic, polyimide, polyethylene terephthalate, polyethylene naphthalate or the like may be used, and it may be formed from a single layer or a stacked multiplayer of multiple layers of any of these.

The insulating layer UC, the insulating layer GI and the insulating layer ILI are each formed from a single layer or a stacked multiplayer of, for example, a silicon oxide film and a silicon nitride film.

The cross-sectional configuration of the display device DSP will be explained for each division of the display area DA, the frame area FA and the area EA of the end portion. In the display area DA, source electrodes SE (signal lines SL) are provided on the insulating layer GI. Although details thereof will be described later, these are the source electrodes SE and signal lines SL of the transistors to drive the pixels PX. The insulating layer ILI is provided to cover the source electrodes SE.

An insulating layer PLN is provided on the insulating layer ILI. The insulating layer PLN is formed of an organic resin material and has a planarization function. As the organic resin material, for example, organic materials such as photosensitive acrylic, polyimide and the like can be listed.

An insulating layer PDL is provided on the insulating layer PLN. The insulating layer PDL is formed using an organic insulating material. As the organic insulating material, for example, organic materials such as photosensitive acrylic, polyimide and the like can be listed. The portion of the insulating layer PDL, which protrudes along the third direction Z is referred to as a bank (which may as well be referred to as a partition, convex portion or rib) BNK.

As will be described in detail later, a light-emitting layer is provided between two banks BNK to constitute a pixel PX. Note that the insulating layer PDL may as well be only a bank BNK, and may not be provided over multiple pixels PX. It suffices if a bank BNK is provided between adjacent pixels PX.

An insulating layer PAS1 is provided on the insulating layer PDL. The insulating layer PAS1 is formed using an inorganic insulating material. As the inorganic insulating material, for example, a single layer of silicon oxide or silicon nitride or a stacked multilayer of these, can be listed. The insulating layer PAS1 has the function of preventing moisture from entering the light emitting layer of a pixel PX from the outside. As the insulating layer PAS1, a material with high gas barrier property is suitable.

An insulating layer PCL is provided on the insulating layer PAS1. The insulating layer PCL has a planarization function and is formed of an organic resin material. As the organic resin material, for example, organic materials such as photosensitive acrylic, polyimide and the like can be listed.

An insulating layer PAS2 is provided on the insulating layer PCL. The insulating layer PAS2 can be formed from a material similar to that of the insulating layer PAS1.

On the insulating layer PCL, wiring lies TL and touch electrodes (not shown) are provided is provided. The insulating layer OC is provided to cover the wiring line TL and the touch electrodes. The insulating layer OC may as well be referred to as an overcoat. The insulating layer OC is formed of a resin material having translucency.

An optical clear adhesive OCA is provided to over the insulating layer OC. The optical clear adhesive OCA adheres a polarizer POL and the insulating layer OC provided thereon. The optical clear adhesive OCA is formed from a transparent adhesive.

In the frame area FA of the display device DSP, the base BA1, the insulating layer UC and the insulating layer ILI are stacked in this order along the third direction Z. From the display area DA towards the frame area FA, the insulating layer PLN and the insulating layer PDL extend on the insulating layer ILI. The insulating layer PLN extends along the second direction Y to an end portion EP. The insulating layer PDL extends along the second direction Y to an end portion EB. A concave portion CX is provided adjacent to the end portions EP and EB along the second direction Y. In the concave portion CX, the insulating layers PLN and PDL are not formed. In the concave portion CX, the insulating layer PAS1 is provided on the insulating layer ILI.

A protrusion ID1 is provided to be spaced apart from the end portions EP and EB along the second direction Y while interposing the concave portion CX therebetween. The protrusion ID1 is formed of the same material as that of the insulating layer PLN. A protrusion ID2 is formed of the same material as that of the insulating layer PDL provided so as to cover the protrusion ID1. The protrusion ID1 and the protrusion ID2 may as well be collectively referred to as protrusions ID. The protrusions ID exhibit the effect of damming the insulating layer PCL. In this embodiment, the protrusions ID may as be referred to as inner dams.

The insulating layer PCL extends on the insulating layer PAS1 from the display area DA towards the frame area FA. The insulating layer PCL extends along the second direction Y to an end portion ECL located on the protrusion ID2. It can be said that the insulating layer PCL is dammed by the protrusion ID.

The insulating layer PAS2 is provided to cover the insulating layer PCL. From the end portion ECL of the insulating layer PCL, the insulating layer PAS2 is provided on the insulating layer PAS1 along the second direction Y. The wiring line TL are provided on the insulating layer PAS2.

An electrode SCE1 is provided on the insulating layer GI along the second direction Y, so as to be spaced apart from the protrusion ID1. The electrode SCE1 is formed of the same material as that of the source electrode SE (signal line SL). Note that in this embodiment, components that are formed of the same material and the same process are referred to as that they are formed in the same layer. The electrode SCE1 and the source electrode SE (signal line SL) are formed in the same layer. The electrode SCE1 extends along the second direction Y from the frame area FA to the area EA. The electrode SCE1 overlaps the protrusion OD in the region which stretches from the frame area FA to the area EA.

An electrode TCE1 is provided on the insulating layer ILI. To the electrode TCE1, the electrode SCE1 is connected via a contact hole CH2 made in the insulating layer ILI. The insulating layer IB1 is provided to cover the electrode TCE1. The insulating layer IB is formed of the same material as that of the insulating layer PLN. The insulating layers PAS1 and PAS2 are provided to cover the insulating layer IB1.

The respective wiring line TL is provided on the electrode TCE1 while interposing the insulating layer IB1, the insulating layer PAS1 and the insulating layer PAS2 therebetween. The wiring line TL is connected to the electrode TCE1 via a contact hole CH1 made in the insulating layer IB1, the insulating layer PAS1 and the insulating layer PAS2.

An insulating layer IB2 is provided on the electrode SCE1 so as to be spaced apart from the insulating layer IB1 along the second direction Y. The insulating layer IB2 is formed of the same material as that of the insulating layer PLN. An end portion of the insulating layer IB2 is defined as a protrusion OD1.

A protrusion OD2 is provided to cover a part of the protrusion OD1. The protrusion OD2 is formed of the same material as that of the insulating layer PDL. The protrusion OD1 and the protrusion OD2 may as well be collectively referred to as protrusions OD. The protrusions OD have the effect of damming the insulating layer OC. In this embodiment, the protrusions OD may as well be referred to as outer dams.

The insulating layer PAS1 is provided on the protrusion OD2. The insulating layer PAS1 extends along the second direction Y to the end portion EP1 located on the protrusion OD2. The material of the insulating layer PAS1 is as described above.

The insulating layer PAS2 is provided on the protrusion OD2 while interposing the insulating layer PAS1 therebetween. The insulating layer PAS2 extends to the end portion EP2 located on the protrusion OD2. The end portion EP1 and the end portion EP2 may be aligned along the third direction Z or may be spaced apart from each other along the second direction Y.

The insulating layer OC is provided to cover the wiring line TL and the insulating layer PAS2. The insulating layer OC is provided to extend through the insulating layer PAS1 and the insulating layer PAS2 to the protrusion OD2. The end portion EOC of the insulating layer OC is provided on the protrusion OD via the insulating layer PAS1 and the insulating layer PAS2.

The polarizer POL is provided on the insulating layer OC via the optical clear adhesive OCA. The region where the polarizer POL is provided is the display area DA and the frame area FA. The polarizer POL is not provided in the area EA.

In the area EA, the electrode SCE1, which extends from the frame area FA, is provided on the insulating layer GI. The electrode SCE1 includes a region connected to the electrode TCE2, which is spaced apart from a region connected to the electrode TCE1 provided in the frame area FA.

The electrode TCE2 is provided on the insulating layer ILI. The electrode TCE2 covers the end portion EIL of the insulating layer ILI and extends along the second direction Y on the insulating layer GI. The electrode TCE2 is formed of the same material as that of the electrode TCE1. The electrode TCE2 is formed in the same layer as that of the electrode TCE1.

The insulating layer IB2 extending from the frame area FA is provided to cover the electrode TCE2. The insulating layer IB2 is not provided on a part of the electrode TCE2, which is therefore exposed. The region where the electrode TCE2 is exposed is the connecting portion TCN. External touch signals are input via the electrode TCE2 of the connecting portion TCN.

The electrode SCE2 is provided on the insulating layer GI so as to be spaced apart from electrode SCE1. The electrode SCE2 is formed in the same layer as that of the electrode SCE1 and the source electrode SE. The electrode TCE2 is in contact with a part of the electrode SCE2. The electrode TCE3 is in contact with another part of the electrode SCE2. The electrode TCE3 is formed in the same layer as that of the electrode TCE1 and the electrode TCE2.

An insulating layer IB3 is provided to cover over the electrode SCE2, a part of the electrode TCE2 and a part of the electrode TCE3. The insulating layer IB3 is provided along the second direction Y, to be spaced apart from the insulating layer IB2 while interposing the connection portion TCN therebetween. The insulating layer IB3 is formed of the same material as that of the insulating layer PLN.

The electrode TCE3 is formed on the insulating layer INS and extends to the end portion EBA1 of the base BA1. The insulating layer INS is formed of a material similar to that of the insulating layer INI. The electrode TCE3 is connected to the electrode SCE2 via a contact hole made in the insulating layer INS.

FIG. 4 is a cross-sectional view schematically showing a configuration example of the display device of Embodiment 1. FIG. 4 shows a cross-sectional configuration of the display area DA of the display device DSP. As described in FIG. 1, the display device DSP comprises a plurality of pixels PX provided therein. Those pixels PX which emit red color (R), those PX which emit green color (G) and those PX which emit blue color (B) are referred to as pixels PXR, PXG and PXB, respectively.

An insulating layer UC1 is provided on the base BA1. The insulating layer UC1 is formed from, for example, a single layer of a silicon oxide film or a silicon nitride film, or a stacked multilayer of either one or both of these.

On the insulating layer UC1, a light-shielding layer BM may be provided to overlap a transistor Tr provided in each pixel PX. The light-shielding layer BM suppresses changes in transistor characteristics due to light penetration from a rear surface of the channel of the transistor Tr, and the like. When the light-shielding layer BM is formed from a conductive layer, it is also possible to impart a back-gate effect to the transistor Tr by providing a predetermined potential.

An insulating layer UC2 is provided to cover the insulating layer UC1 and the light-shielding layer BM. As the material of the insulating layer UC2, one similar to that of the insulating layer UC1 can be used. The insulating layer UC2 may as well be a material different from that of the insulating layer UC1. For example, silicon oxide can be used for the insulating layer UC1 and silicon nitride for the insulating layer UC2. The insulating layers UC1 and UC2 are collectively referred to as the insulating layers UC described above.

The transistor Tr is provided on the insulating layer UC. The transistor Tr includes a semiconductor layer SC, an insulating layer GI, a gate electrode GE (a scanning line), an insulating layer ILI, a source electrode SE (a signal line SL) and a drain electrode DE.

As the semiconductor layer SC, amorphous silicon, polysilicon or oxide semiconductor is used.

As the gate electrode GE, for example, a molybdenum-tungsten alloy (MoW) is used. The gate electrode GE may be formed to be integrated with the respective scanning line.

The insulating layer ILI is provided to cover the semiconductor layer SC and the gate electrode GE.

On the insulating layer ILI, a source electrode SE and a drain electrode DE are provided. The source electrode SE and the drain electrode DE are connected to a source region and a drain region of the semiconductor layer SC, respectively, via contact holes made in the insulating layer ILI and the insulating layer GI. The source electrode SE may be formed to be integrated with the respective signal line SL.

An insulating layer PSS is provided to cover the source electrode SE, the drain electrode DE and the insulating layer ILI. An insulating layer PLN is provided to cover the insulating layer PSS. The insulating layer PSS is formed using an inorganic insulating material. The inorganic insulating material is, for example, a single layer of silicon oxide or silicon nitride or a stacked multilayer of one or both of these. The insulating layer PLN is formed using an organic insulating material as described above. With the insulating layer PLN thus provided, steps caused by the transistor Tr can be planarized.

The pixel electrode PE is provided on the insulating layer PLN. The pixel electrodes of the pixel PXR, the pixel PXG and the pixel PXB will be referred to as a pixel electrode PER, a pixel electrode PEG and a pixel electrode PEB, respectively. The pixel electrodes PE (pixel electrode PER, pixel electrode PEG and pixel electrode PEB) are connected to the drain electrodes DE via contact holes made in the insulating layer PSS and the insulating layer PLN. The pixel electrodes PE are each formed, for example, by a three-layer stacked structure of indium zinc oxide (IZO), silver (Ag) and IZO.

A bank BK is provided between each adjacent pair of pixel electrodes PE. The bank BK is opened to expose a part of the pixel electrodes PE. An end portion of an aperture OP should preferably be should be formed to have a gently tapered shape in cross-sectional view. If the end portion of the aperture OP has a steep shape, coverage error may occur in the organic EL layer ELY, which is formed later.

The organic EL layer ELY is provided between each adjacent pair of banks BK so as to overlap the respective pixel electrode PE. The organic EL layers of the pixel PXR, the pixel PXG and the pixel PXB are referred to as an organic EL layer ELR, an organic EL layer ELG and an organic EL layer ELB, respectively. The organic EL layer ELY contains a light-emitting layer composed of an organic EL material, and may further contain a hole injection layer, a hole transport layer, an electron blocking layer, a hole blocking layer, an electron transport layer and an electron injection layer.

A common electrode CE is provided on the organic EL layer ELY. As the common electrode CE, a magnesium-silver alloy (MgAg) film is formed into such a thin film that the light emitted from the organic EL layer ELY is transmitted. In this embodiment, the pixel electrode PE serves as an anode and the common electrode CE serves as a cathode. The light generated in the organic EL layer ELY is extracted upward through the common electrode CE. In other words, the display device DSP has a top emission structure.

The insulating layer PAS1 is provided to cover the common electrode CE. The insulating layer PAS1 has the function of preventing moisture from entering the organic EL layer ELY from outside.

The insulating layer PCL is provided to cover the insulating layer PAS1. The wiring line TL is provided on the insulating layer PCL. In FIG. 4, the wiring line TL is provided in the pixel PXB and the pixel PXG, but the configuration is not limited to this.

A touch electrode TX is provided on the insulating layer PCL so as to overlap a part of the wiring line TL. The touch electrode TX can be made of a transparent conductive material such as indium tin oxide (ITO), indium zinc oxide (IZO) or the like.

An insulating layer OC is provided on the touch electrode TX. As to the cross-sectional configuration from the insulating layer OC to the polarizer POL, the explanation thereof should be referred to that provided with reference to FIG. 3, and it is omitted here.

FIG. 5 is a plan view of a display device of a comparative example. In a touch panel TPr of a display device DSPr shown in FIG. 5, inspection pads TD are provided between wiring line TL and a connecting portion TCN. The inspection pads TD are each a pad used to inspect short-circuiting of the respective touch electrode TX and the respective wiring line TL or the like, of the touch panel. The inspection pads TD are not directly related to the touch function and are not necessary after the touch panel is completed.

The inspection pads TD connected to the wiring line TL1 to TL16 are designated as inspection pad TD1 to inspection pad TD16, respectively. The inspection pad TD1 to inspection pad TD16 are arranged disposed on the base BA1. The inspection pads TD are connected to the connecting portion TCN via wiring lines CL (wiring line CL1 to wiring line CL4).

Touch panels and display devices comprising touch panels are developing increasingly in terms of form flexibility and narrower frames. As shown in FIG. 5, when the inspection pads TD are placed on the base BA1, the area of the touch panel TPr increases, thereby preventing from achieving a narrower frame.

In this embodiment, the inspection pads are placed outside the touch panel. With this configuration, it is possible to prevent the area of the touch panel from increasing. Therefore, the frame of the touch panel and that of the display device comprising the touch panel can be narrowed.

FIG. 6 is a plan view schematically showing a configuration example of individual elements of Embodiment 1. In FIG. 6, the element which includes touch electrodes TX, wiring line TL, a connecting portion TCN, wiring lines CL and inspection pads TD on the base BA1 is referred to as an individual element PAE.

In the individual element PAE, the wiring lines CL are connected to the wiring line TL via the connecting portion TCN. The wiring lines CL connected to the wiring line TL1 to TL16 are referred to as a wiring line CL1 to a wiring line CL16. The wiring line CL1 and the wiring line CL5 are connected to each other. So are the wiring line CL2 and the wiring line CL6, the wiring line CL3 and the wiring line CL7, the wiring line CL4 and the wiring line CL8, the wiring line CL9 and the wiring line CL13, the wiring line CL10 and the wiring line CL14, the wiring line CL11 and the wiring line CL15, and the wiring line CL12 and the wiring line CL16.

In other words, the touch electrode TX1 and the touch electrode TX5 are connected to an inspection pad TD1_5, in which the inspection pad TD1 and the inspection pad TD5 are formed to be integrated with each other, via the wiring line TL1 and the wiring line TL5, and the wiring line CL1 and the wiring line CL5, respectively.

The touch electrode TX2 and the touch electrode TX6 are connected to an inspection pad TD2_6, in which the inspection pad TD2 and the inspection pad TD6 are formed to be integrated, via the wiring line TL2 and the wiring line TL6, and the wiring line CL2 and the wiring line CL6, respectively.

The touch electrode TX3 and the touch electrode TX7 are connected to an inspection pad TD3_7, in which the inspection pad TD3 and the inspection pad TD7 are formed to be integrated, via the wiring line TL3 and the wiring line TL7, and the wiring line CL3 and the wiring line CL7, respectively.

The touch electrode TX4 and the touch electrode TX8 are connected to an inspection pad TD4_8, in which the inspection pad TD4 and the inspection pad TD8 are formed to be integrated, via the wiring line TL4 and the wiring line TL8, and the wiring line CL4 and the wiring line CL8, respectively.

The touch electrodes TX9 and TX13 are connected to an inspection pad TD9_13, in which the inspection pads TD9 and TD13 are formed to be integrated, via the wiring line TL9 and TL13 and the wiring lines CL9 and CL13, respectively.

The touch electrode TX10 and the touch electrode TX14 are connected to an inspection pad TD10_14, in which the inspection pad TD10 and the inspection pad TD14 are formed to be integrated, via the wiring line TL10 and the wiring line TL14 and the wiring line CL10 and the wiring line CL14, respectively.

The touch electrode TX11 and the touch electrode TX15 are connected to an inspection pad TD11_15, in which the inspection pad TD11 and the inspection pad TD15 are formed integrated, via the wiring line TL11 and the wiring line TL15, and the wiring line CL11 and the wiring line CL15, respectively.

The touch electrode TX12 and the touch electrode TX16 are connected to an inspection pad TD12_16, in which the inspection pad TD12 and the inspection pad TD16 are formed to be integrated, via the wiring line TL12 and the wiring line TL16, and the wiring line CL12 and the wiring line CL16, respectively.

A cutting line KL is set between the inspection pads TD (inspection pad TD1_5 to inspection pad TD12_16) and the connecting portion TCN. By cutting the individual element PAE at the cutting line KL, a display device DSP including a touch panel TP is formed. Here, the inspection pads TD are formed outside the touch panel TP, and therefore the area of the touch panel TP does not increase. As a result, a touch panel TP with a narrower frame can be obtained.

Further, as described above, inspection pads TD corresponding to touch electrodes TX are bundled together into pairs to carry out inspection for shortcuts. For example, by combining touch electrodes TX such as touch electrodes TX1 and TX5 which are located at a distance from each other where adjacent short-circuits do not occur, it is possible to prevent the outflow of defects.

Figure 7:
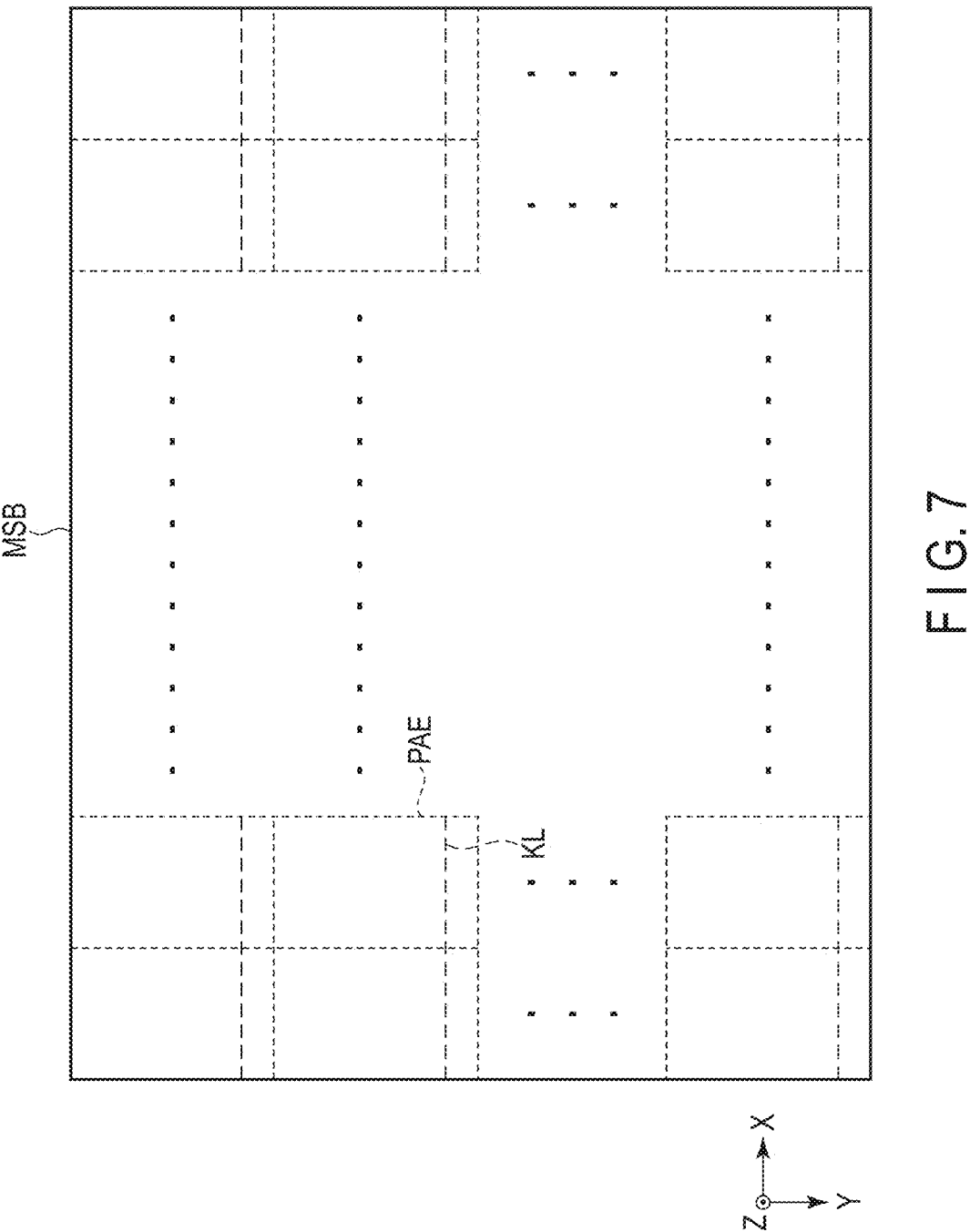
FIG. 7 is a plan view showing a substrate on which a plurality of individual elements are provided.

FIG. 7 shows a plan view of a substrate on which a plurality of individual elements are provided. As seen, a plurality of individual elements PAEs are formed on a large-scale substrate MSB (which may as well be called mother substrate). The substrate MSB on which the plurality of individual elements PAEs are formed is divided into pieces in order to separate the individual elements PAEs into their respective parts.

Note that, although not shown in FIG. 7, each individual element PAE is provided with inspection pads TD as in the case shown in FIG. 6.

After the inspection using the inspection pads TD is completed, the individual elements PAE are divided along the cutting lines KL (see FIG. 3). Thereafter, the wiring substrate PCS2 is provided via the connecting portion TCN, and thus the display device DSP with the touch panel TP is formed (see FIG. 2).

FIG. 8 is a cross-sectional view schematically showing a configuration example of the individual elements of Embodiment 1. In FIG. 8, the configuration along the second direction Y from the display area DA to the cutting line KL of the area EA is similar to those up to FIG. 3. The individual element PAE shown in FIG. 8, which has been cut at the cutting line KL, gives rise to the display device DSP shown in FIG. 3.

The cutting line KL shown in FIG. 8 is set to overlap the electrode SCE2. As shown in the right-hand side of the cutting line KL on the page, the electrode SCE2 is connected to the electrode TCE3. The electrode TCE3 extends along the second direction Y on the insulating layer INS. An insulating layer IB4 is provided on the insulating layer INS so as to be spaced apart from the insulating layer IB3 along the second direction Y. The electrode TCE3 extends to the insulating layer IB4. The electrode TCE3 between the insulating layers IB3 and IB4 is exposed. The region thus exposed serves as an inspection pad TD. The insulating layer IB4 is formed of the same material as that of the insulating layer PLN.

The inspection pads TD are used for inspection of the display device DSP (touch panel TP) before shipment. Therefore, it is not necessary for the display device DSP after shipment. Thus, when the inspection pads TD are cut off at the cutting line KL, there will rise no particular problems thereby.

FIG. 9 is a plan view schematically showing a configuration example of the individual element of Embodiment 1. FIG. 10 is an enlarged view of the region RG enclosed by the dotted line in FIG. 9. FIG. 11 is a plan view showing inspection pads and wiring lines connected thereto. FIG. 12 is a plan view showing the wiring lines that connect the signal lines connected to the pixels to the inspection pads for display. FIGS. 11 and 12 are enlarged plan views of parts extracted form FIG. 9.

The display device DSP shown in FIG. 9 includes wiring lines that connect the touch electrodes TX to the inspection pads, and connect the signal lines connected to the pixels in the display area to the inspection pads for display. In FIG. 9, for the sake of clarity in illustration, only the wiring line that connects the touch electrode TX1 to the inspection pad TD1_5 and the wiring line connected to the inspection pad DD1 for display are designated by reference symbols.

All of the touch electrodes TX overlap the insulating layer PCL in plan view. The entire surface of the insulating layer PCL overlaps the insulating layer OC in plan view. All of the touch electrodes TX and all of the wiring line TL overlap the insulating layer PCL in plan view. The area of the insulating layer PCL in plan view is smaller than that of the insulating layer OC. The area of the insulating layer OC in plan view is smaller than that of the base BA1.

In connection with the touch electrodes TX, the wiring line TL extend substantially along the second direction Y. As described above, the wiring line TL extend to above the protrusion ID1 and the protrusion ID2 (protrusions ID) on the stacked layer of the insulating layers PCL and PAS1 (see FIGS. 3 and 8). Note that, as shown in FIG. 9, the wiring line TL may be bent along the first direction X in the zone in which they extend over the protrusions ID, in order for such reasons as avoiding other wiring lines or effectively utilizing the occupied area.

As shown in FIG. 10, for example, the wiring line TL1 is connected to the wiring line T1_1 via a contact hole CH1_1 between the protrusion ID and the protrusion OD. The wiring line T1_1 corresponds to the electrode TCE1 shown in FIGS. 3 and 8. The contact hole CH1_1 is the same as the contact holes CH1 provided in the insulating layer PAS1, the insulating layer PAS2 and the insulating layer IB1 shown in FIGS. 3 and 8.

Further, the wiring line T1_1 (electrode TCE1) is connected to the wiring line S1_1 via a contact hole CH2_1. The wiring line S1_1 corresponds to the electrode SCE1 shown in FIG. 3 and FIG. 8. The contact hole CH2_1 is the same as the contact hole CH2 provided in the insulating layer ILI shown in FIGS. 3 and 8. The wiring line S1_1 (electrode SCE1) extends along the second direction Y.

In the example shown in FIG. 10, the wiring line TL1 to TL8 overlap the protrusion ID in plan view. The wirings S1_1 to S1_8 overlap the protrusion OD in plan view.

FIG. 10 illustrates the connection of the wiring line TL1, the wiring line T1_1 and the wiring line S1_1 and shows wiring line T1_1 to T1_8 and wiring lines S1_1 through S1_8, which are connected to the wiring line TL1 to TL8, respectively. Note that the wiring line TL9 to TL16 and the wirings connected respectively thereto have a connection relationship similar to that of FIG. 10.

With reference back to FIG. 9, for example, the explanation of the wiring line S1_1 will now be continued. The wiring line S1_1 (electrode SCE1) is connected to the wiring line T2_1. The wiring line T2_1 corresponds to the electrode TCE2 shown in FIGS. 3 and 8.

On the region from the wiring line T2_1 to the wiring line T2_16 (which will be discussed later), that is, the region where the electrode TCE2 is provided, an insulation layer is partially not provided, and therefore such parts are exposed (see FIGS. 3 and 8). The exposed regions are the connecting portion TCN.

FIG. 11 is a plan view of the wiring lines from the wiring line TL to the inspection pads TD. The wiring line T2_1 is connected to the wiring line S2_1. The wiring line S2_1 corresponds to the electrode SCE2 shown in FIG. 3 and FIG. 8. The wiring line S2_1 is connected to the inspection pad TD1_5. The wiring line S2_1 corresponds to the wiring line CL1 shown in FIG. 6.

The wiring line TL2, the wiring line S1_2, the wiring line T2_2 and the wiring line S2_2 are connected in a manner similar to that of the wiring line TL1, the wiring line S1_1, the wiring line T2_1 and the wiring line S2_1. The wiring line S2_2 corresponds to the wiring line CL2 shown in FIG.

6. Although not shown in FIG. 11, the wiring line T1_2 is provided between the wiring line TL2 and the wiring line S1_2 (see FIG. 10).

The wiring line TL3, the wiring line S1_3, the wiring line T2_3 and the wiring line S2_3 are connected in a manner similar to that of the wiring line TL1, the wiring line S1_1, the wiring line T2_1 and the wiring line S2_1. The wiring line S2_3 corresponds to the wiring line CL3 shown in FIG. 6. Although not shown in FIG. 11, the wiring line T1_3 is provided between the wiring line TL3 and the wiring line S1_3 (see FIG. 10).

The wiring line TL4, the wiring line S1_4, the wiring line T2_4 and the wiring line S2_4 are connected in a manner similar to that of the wiring line TL1, the wiring line S1_1, the wiring line T2_1 and the wiring line S2_1. The wiring line S2_4 corresponds to the wiring line CL4 shown in FIG. 6. Although not shown in FIG. 11, the wiring line T1_4 is provided between the wiring line TL4 and the wiring line S1_4 (see FIG. 10).

The wiring line TL5, the wiring line S1_5, and the wiring line T2_5 are connected in a manner similar to that of the wiring line TL1, the wiring line S1_1 and the wiring line T2_1. The wiring line T2_5 is connected to the wiring line S2_1. A part of the wiring line T2_5 corresponds to the wiring line CL5 shown in FIG. 6. Although not shown in FIG. 11, the wiring line T1_5 is provided between the wiring line TL5 and the wiring line S1_5 (see FIG. 10).

The wiring line TL6, the wiring line S1_6 and the wiring line T2_6 are connected in a manner similar to that of the wiring line TL1, the wiring line S1_1 and the wiring line T2_1. The wiring line T2_6 is connected to the wiring line S2_2. A part of the wiring line T2_6 corresponds to the wiring line CL6 shown in FIG. 11, the wiring line T1_6 is provided between the wiring line TL6 and the wiring line S1_6 (see FIG. 10).

The wiring line TL7, the wiring line S1_7 and the wiring line T2_7 are connected in a manner similar to that of the wiring line TL1, the wiring line S1_1 and the wiring line T2_1. The wiring line T2_7 is connected to the wiring line S2_3. A part of the wiring line T2_7 corresponds to the wiring line CL7 shown in FIG. 6. Although not shown in FIG. 11, the wiring line T1_7 is provided between the wiring line TL7 and the wiring line S1_7 (see FIG. 10).

The wiring line TL8, wiring line S1_8 and the wiring line T2_8 are connected in a manner similar to that of the wiring line TL1, the wiring line S1_1 and the wiring line T2_1. The wiring line T2_8 is connected to the wiring line S2_4. A part of the wiring line T2_8 corresponds to the wiring line CL8 shown in FIG. 6. Although not shown in FIG. 11, the wiring line T1_8 is provided between the wiring line TL8 and the wiring line S1_8 (see FIG. 10).

The wiring line TL9, the wiring line S1_9, the wiring line T2_9 and the wiring line S2_9 are connected in a manner similar to that of the wiring line TL1, the wiring line S1_1, the wiring line T2_1 and the wiring line S2_1. The wiring line S2_9 corresponds to the wiring line CL9 shown in FIG. 6. Although not shown in FIG. 11, the wiring line T1_9 is provided between the wiring line TL9 and the wiring line S1_9.

The wiring line TL10, the wiring line S1_10, the wiring line T2_10 and the wiring line S2_10 are connected in a manner similar to that of the wiring line TL1, the wiring line S1_1, the wiring line T2_1 and the wiring line S2_1. The wiring line S2_10 corresponds to the wiring line CL10 shown in FIG. 6. Although not shown in FIG. 11, the wiring line T1_10 is provided between the wiring line TL10 and the wiring line S1_10.

The wiring line TL11, the wiring line S1_11, wiring line T2_11 and the wiring line S2_11 are connected in a manner similar to that of the wiring line TL1, the wiring line S1_1, the wiring line T2_1 and the wiring line S2_1. The wiring line S2_11 corresponds to the wiring line CL11 shown in FIG. 6. Although not shown in FIG. 11, the wiring line T1_11 is provided between the wiring line TL11 and the wiring line S1_11.

The wiring line TL12, the wiring line S1_12, the wiring line T2_12 and the wiring line S2_12 are connected in a manner similar to that of the wiring line TL1, the wiring line S1_1, the wiring line T2_1 and the wiring line S2_1. The wiring line S2_12 corresponds to the wiring line CL12 shown in FIG. 6. Although not shown in FIG. 11, the wiring line T1_12 is provided between the wiring line TL12 and the wiring line S1_12.

The wiring line TL13, the wiring line S1_13 and the wiring line T2_13 are connected in a manner similar to that of the wiring line TL1, the wiring line S1_1 and the wiring line T2_1. The wiring line T2_13 is connected to the wiring line S2_9. A part of the wiring line T2_13 corresponds to the wiring line CL13 shown in FIG. 6. Although not shown in FIG. 11, the wiring line T1_13 is provided between the wiring line TL13 and the wiring line S1_13.

The wiring line TL14, the wiring line S1_14 and the wiring line T2_14 are connected in a manner similar to that of the wiring line TL1, the wiring line S1_1 and the wiring line T2_1. The wiring line T2_14 is connected to the wiring line S2_10. A part of the wiring line T2_14 corresponds to the wiring line CL14 shown in FIG. 6. Although not shown in FIG. 11, the wiring line T1_14 is provided between the wiring line TL14 and the wiring line S1_14.

The wiring line TL15, the wiring line S1_15 and the wiring line T2_15 are connected in a manner similar to that of the wiring line TL1, the wiring line S1_1 and the wiring line T2_1. The wiring line T2_15 is connected to the wiring line S2_11. A part of the wiring line T2_15 corresponds to the wiring line CL15 shown in FIG. 6. Although not shown in FIG. 11, the wiring line T1_15 is provided between the wiring line TL15 and the wiring line S1_15.

The wiring line TL16, the wiring line S1_16 and the wiring line T2_16 are connected in a manner similar to that of the wiring line TL1, the wiring line S1_1 and the wiring line T2_1. The wiring line T2_16 is connected to the wiring line S2_12. A part of the wiring line T2_16 corresponds to the wiring line CL16 shown in FIG. 6. Although not shown in FIG. 11, the wiring line T1_16 is provided between the wiring line TL16 and the wiring line S1_16.

The touch electrodes TX, that is, the wiring lines (wiring lines S2_1 to S2_4 and wiring lines S2_9 to S2_12 (corresponding to the electrode SCE2)) electrically connected to the respective wiring lines TL are connected to the wiring lines (wiring lines T2_5 to T2_8 and the wiring lines T2_13 to T2_16 (corresponding to the electrode TCE2)) electrically connected to some other ones of the touch electrodes TX, which are located at a remote distance. For example, as described above, the wiring line S2_1 electrically connected to the touch electrode TX1 is connected to the wiring line T2_5 electrically connected to the touch electrode TX5. With this configuration, it is possible to combine touch electrodes TX located at distant locations where adjacent short-circuiting does not occur, thereby preventing the outflow of defects.

As shown in FIGS. 9 and 11, the wiring lines S2_1 to S2_4, the wiring lines S2_9 to S2_12, the wiring lines T2_5 to T2_8 and the wiring lines T2_13 to T2_16 extend to the end portion of the base BA1. In other words, all of the wiring lines corresponding to the electrode SCE2 (which will be referred to as wiring lines S2) extend to the end portion of the base BA1. Further, of all the wiring lines T2_1 to T2_16 corresponding to the electrode TCE2, half of these, that is, the wiring lines T2_5 to T2_8 and the wiring lines T2_13 to T2_16 extend to the end portion of the base BA1.

With reference to FIG. 12, the wiring configuration from the wiring lines S1_d1 to S1_d26 which extend from the display area DA to the inspection pads DD1 to DD13 for display will be described. The wiring lines S1_d1 to S1_d26 may be of signal lines SL extended, of signal lines SL and scanning lines extended, or of signal lines SL, scanning lines and other wiring lines used for display, extended.

The wiring line S1_d1, the wiring line T2_d1, the wiring line S2_d1 and the inspection pad DD1 are connected to each other. The wiring line S1_d1, the wiring line T2_d1, the wiring line S2_d1 and the inspection pad DD1 are connected in a manner similar to that of the wiring line S1_1, the wiring line T2_1, the wiring line S2_1 and the inspection pad TD1_5. In other words, the wiring line S1_d1 is provided in the same layer as that of the electrode SCE1. The wiring line T2_1 is provided in the same layer as that of the electrode TCE2. The wiring line S2_d1 is provided in the same layer as that of the electrode SCE2. The inspection pad DD1 is provided in the same layer as that of the electrode TCE3.

The wiring line S1_d2, the wiring line T2_d2, the wiring line S2_d2 and the inspection pad DD2 are connected in a manner similar to that of the wiring line S1_1, the wiring line T2_1, the wiring line S2_1 and the inspection pad TD1_5, respectively.

The wiring line S1_d3, the wiring line T2_d3, the wiring line S2_d3 and the inspection pad DD3 are connected in a manner similar to that of the wiring line S1_1, the wiring line T2_1, the wiring line S2_1 and the inspection pad TD1_5, respectively.

The wiring line S1_d4 and the wiring line T2_d4, the wiring line S1_d5 and the wiring line T2_d5, the wiring line S1_d6 and the wiring line T2_d6, and the wiring line S1_d7 and the wiring line T2_d7 are connected in a manner similar to that of the wiring line S1_1 and the wiring line T2_1, respectively.

The wiring lines T2_d4 to T2_d7 are connected to the wiring line S2_d4. The wiring line S2_d4 and the inspection pad DD4 are connected in a manner similar to that of the wiring line S2_1 and the inspection pad TD1_5, respectively.

The wiring line S1_d8, the wiring line T2_d8, the wiring line S2_d5 and the inspection pad DD5 are connected in a manner similar to that of the wiring line S1_1, the wiring line T2_1, the wiring line S2_1 and the inspection pad TD1_5, respectively.

The wiring line S1_d9, the wiring line T2_d9, the wiring line S2_d6 and the inspection pad DD6 are connected in a manner similar to that of the wiring line S1_1, the wiring line T2_1, the wiring line S2_1 and the inspection pad TD1_5, respectively.

The wiring lines S1_d10 and T2_d10, the wiring lines S1_d11 and T2_d11, the wiring lines S1_d12 and T2_d12, the wiring line S1_d13 and T2_d13, the wiring line S1_d14 and T2_d14, the wiring line S1_d15 and T2_d15, the wiring line S1_d16 and T2_d16 and the wiring lines S1_d17 and T2_d17 are connected in a manner similar to that of the wiring line S1_1 and the wiring line T2_1, respectively.

The wiring lines T2_$d$10 to T2_$d$17 are connected to the wiring line S2_$d$7. The wiring line S2_$d$7 and the inspection pad DD7 are connected in a manner similar to that of the wiring line S2_1 and the inspection pad TD1_5, respectively.

The wiring line S1_$d$18, the wiring line T2_$d$18, the wiring line S2_$d$8 and the inspection pad DD8 are connected in a manner similar to that of the wiring line S1_1, the wiring line T2_1, the wiring line S2_1 and the inspection pad TD1_5, respectively.

The wiring line S1_$d$19, the wiring line T2_$d$19, the wiring line S2_$d$9 and the inspection pad DD9 are connected in a manner similar to that of the wiring line S1_1, the wiring line T2_1, the wiring line S2_1 and the inspection pad TD1_5, respectively.

The wiring line S1_$d$20 and T2_$d$20, the wiring lines S1_$d$21 and T2_$d$21, the wiring lines S1_$d$22 and T2_$d$22, the wiring line S1_$d$23 and T2_$d$23 are connected in a manner similar to that of the wiring lines S1_1 and T2_1, respectively.

The wiring lines T2_$d$20 to T2_$d$23 are connected to the wiring line S2_$d$10. The wiring line S2_$d$10 and the inspection pad DD10 are connected in a manner similar to that of the wiring line S2_1 and the inspection pad TD1_5, respectively.

The wiring line S1_$d$24, the wiring line T2_$d$24, the wiring line S2_$d$11 and the inspection pad DD11 are connected in a manner similar to that of the wiring line S1_1, the wiring line T2_1, the wiring line S2_1 and the inspection pad TD1_5, respectively.

The wiring line S1_$d$25, the wiring line T2_$d$25, the wiring line S2_$d$12 and the inspection pad DD12 are connected in a manner similar to that of the wiring line S1_1, the wiring line T2_1, the wiring line S2_1 and the inspection pad TD1_5, respectively.

The wiring line S1_$d$26, the wiring line T2_$d$26, the wiring line S2_$d$13 and the inspection pad DD13 are connected in a manner similar to that of the wiring line S1_1, the wiring line T2_1, the wiring line S2_1 and the inspection pad TD1_5, respectively.

The wiring lined TL1 to TL16 are formed in some other layer from that of the wiring lines S1_$d$1 to S1_$d$26 (see FIG. 9). With this configuration, the wiring lines TL1 to TL16 and the wiring lines S1_$d$1 to S1_$d$26 are not subjected to short-circuiting even if they overlap each other in plan view. In FIGS. 9 and 12, for example, the wiring lines TL5 to TL8 and the wiring lines S1_$d$1 to S1_$d$4 respectively overlap each other in plan view. In addition, the wiring lines TL9 to TL12 and the wiring lines S1_$d$23 to S1_$d$26 respectively overlap each other in plan view. With this configuration, it is possible to effectively use the area occupied by these wiring lines.

In the display device DSP of this embodiment, the inspection pads TD are not provided inside but outside. With this configuration, it is possible to prevent an increase in area. Thus, the frame of the display device DSP can be formed narrower.

Further, in this embodiment, the wiring lines from the touch electrodes TX to the inspection pads TD are bundled into groups of those connected to the touch electrodes TX located at such a remote distance that adjacent short-circuiting do not occur. With this configuration, it is possible to prevent the outflow of defects.

Embodiment 2

Figure 13:
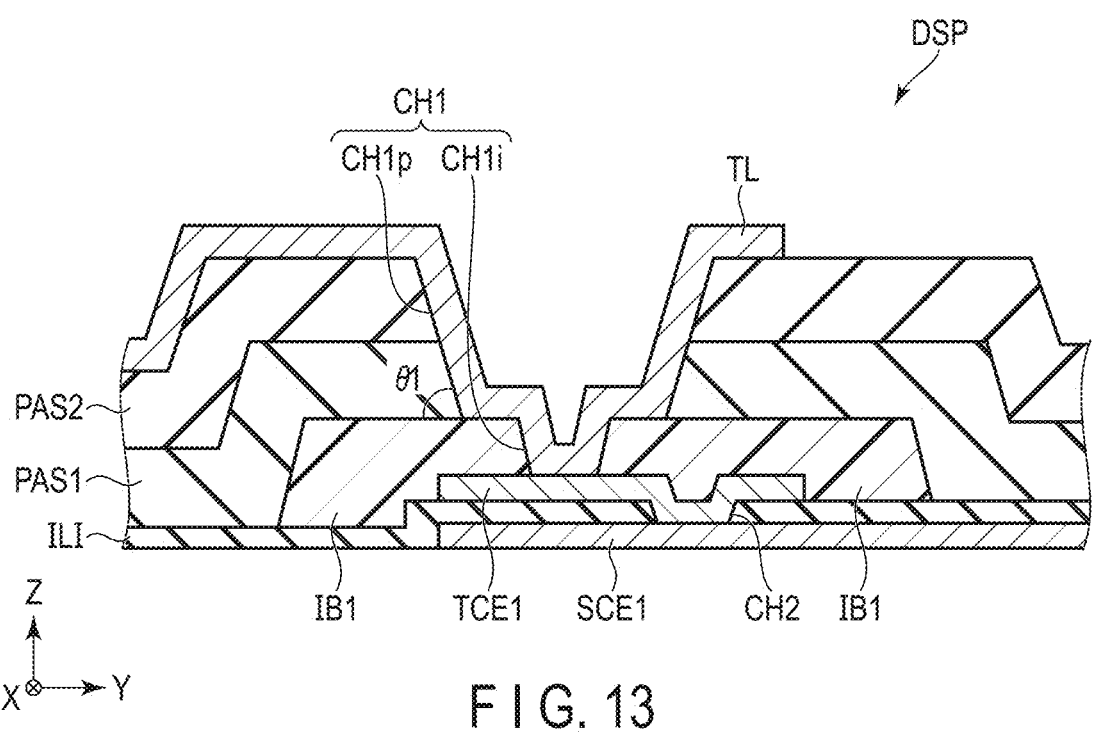
FIG. 13 is a cross-sectional view schematically showing a configuration example of the display device in Embodiment 2.

FIG. 13 is a cross-sectional view schematically showing a configuration of a display device in Embodiment 2. FIG. 13 is a partially enlarged view of FIGS. 3 and 8.

In this embodiment, exposure masks subjected to gray tone processing are used in the formation of contact holes in insulating layers PAS1 and PAS2. With use of a exposure mask subjected to gray-tone processing (which may as well be referred to as a gray-tone mask), it is possible to form contact holes with a small taper angle.

FIG. 13 shows a cross-sectional shape of the region where an electrode SCE1, an electrode TCE1 and a wiring line TL are connected. As described above, the wiring line TL is connected to the electrode TCE1 via a contact hole CH1 made in the insulating layer PAS1, the insulating layer PAS2 and the insulating layer IB1. Note that in this embodiment, of the contact hole CH1, the contact hole formed in the insulating layer PAS1 and the insulating layer PAS2 is referred to as a contact hole CH1$p$, and the contact hole formed in the insulating layer IB1 is referred to as a contact hole CH1$i$.

Let us consider now the case where the contact hole CH1$p$ is formed in the insulating layer PAS1 and the insulating layer PAS2. The insulating layer PAS1 and the insulating layer PAS2 are formed so that the total film thickness is, for example, 2 μm. When a contact hole is formed in an insulating layer with such a thick film thickness, the taper angle at an end portion of the contact hole becomes large. When a conductive layer (in this case, a wiring line TL) is provided through the contact hole, the conductive layer may break in the middle of the contact hole, resulting in a short cut.

Figure 14:
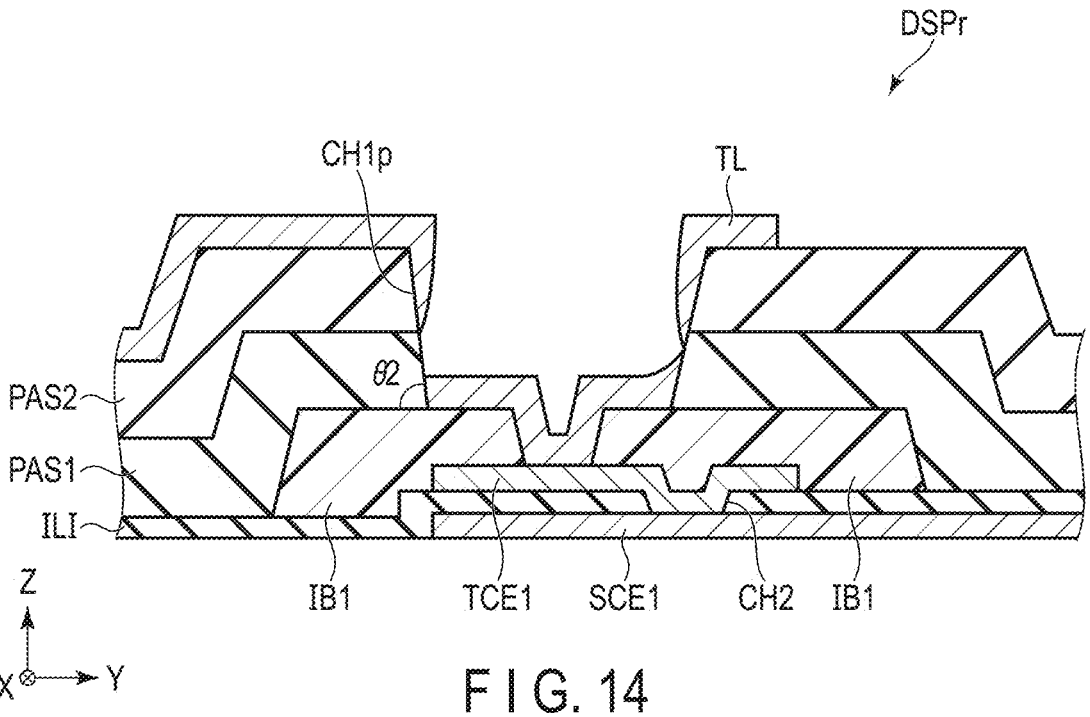
FIG. 14 is a cross-sectional view showing a display device of a comparative example.

FIG. 14 is a cross-sectional view of a display device in a comparative example. In the display device DSPr shown in FIG. 14, the taper angle (θ2) of the end portion of the contact hole CH1$p$ made in the insulating layer PAS1 and the insulating layer PAS2 is larger than the taper angle (θ1) shown in FIG. 13 (θ2>θ1). In the display device DSPr, the wiring line TL is cut in the middle of the contact hole CH1$p$, or its film thickness is thin. Such wiring line TL cannot be electrically connected to the electrode TCE1. Therefore, signals cannot be input/output to/from the respective touch electrode TX.

Figure 15:
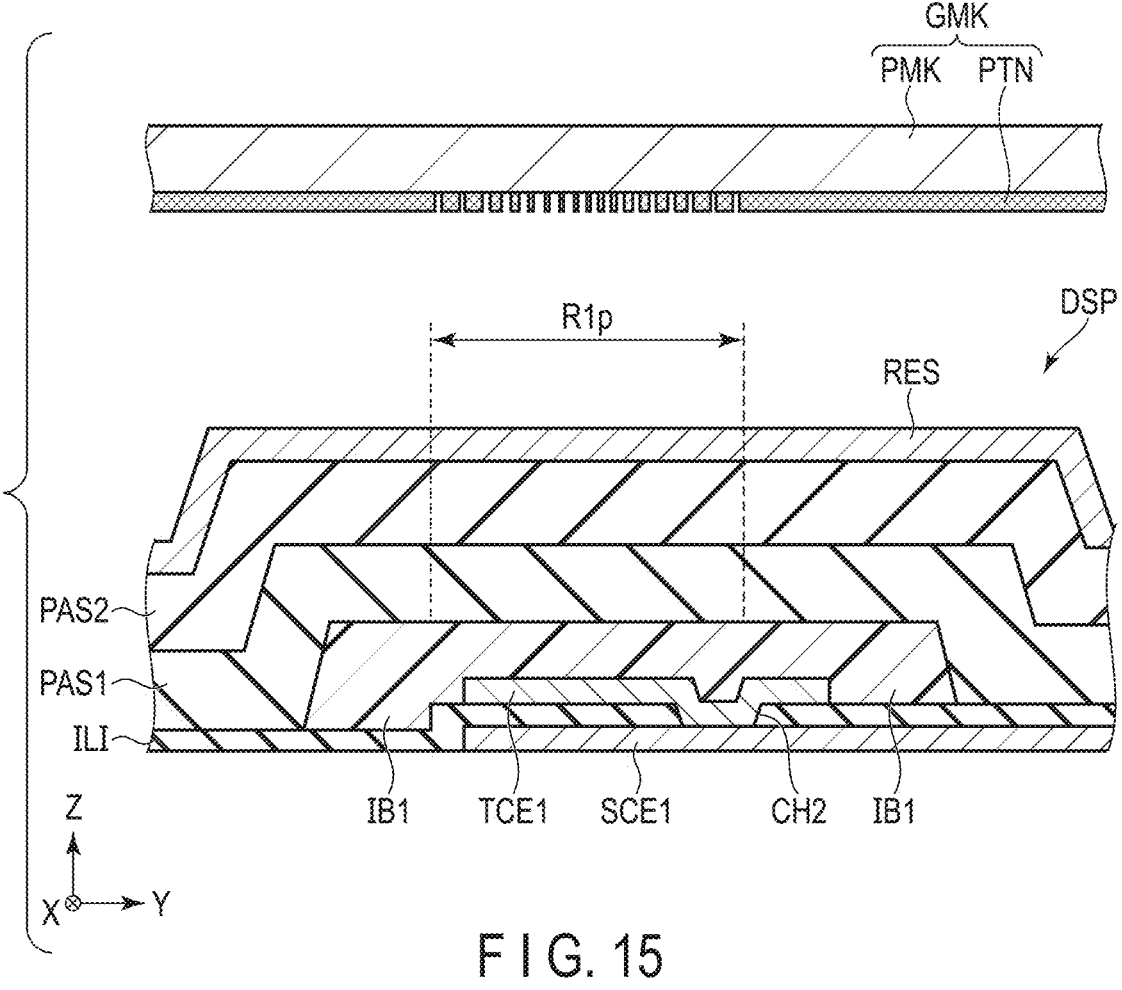
FIG. 15 is a cross-sectional view showing a method of manufacturing the display device in Embodiment 2.

A method of manufacturing the display device DSP shown in FIG. 13 will be explained with reference to FIGS. 15 through 17. FIGS. 15 to 17 are cross-sectional views illustrating the method of manufacturing the display device of Embodiment 2. FIG. 18 is a cross-sectional view showing a method of manufacturing a display device of a comparative example.

After forming the insulating layer PAS1 and the insulating layer PAS2, a resist RES is formed to cover the insulating layer PAS2. Then, exposure is performed using a gray-tone mask GMK (see FIG. 15). In the gray-tone mask GMK, a pattern PTN of lines with various widths is formed on a photomask PMK. The pattern PTN is formed of a material having light-shielding properties, that is, for example, a thin film of chromium (Cr).

In a region R1$p$ where the contact hole CH1$p$ is formed, the pattern PTN has narrower line widths as the location approaches the center of the region R1$p$. In other words, the pattern PTN changes from dense to coarse as the location approaches the center of the region R1$p$. As a result, as the location is closer to the center of the region R1$p$, the amount of exposure to the resist RES is greater.

After the exposure using the gray tone mask GMK, the resist RES is etched. Thus, the resist RES has a taper from the end portion of the region R1$p$ towards the center (see FIG. 16). When the insulating layer PAS1 and the insulating layer PAS2 are etched using the resist RES with the taper, it is possible to obtain a contact hole CH1$p$ with a small taper angle θ1 at the end portion. The resist RES is then removed (see FIG. 17).

On the other hand, in the manufacturing method of display device DSPr of the comparative example shown in FIG. 18, the pattern PTN is not formed in the region R1$p$ of the exposure mask NMK, but the pattern PTN is formed in the regions other than the region R1$p$. When the insulating layer PAS1 and the insulating layer PAS2 are etched by using the resist RES exposed by the exposure mask NMK, a contact hole CH1$p$ with a large taper angle θ2 at the end portion is obtained (see FIG. 14). As described above, in the display device DSPr, there is a risk that the wiring line TL will be stepped cut in the contact hole CH1$p$.

In this embodiment, the exposure process is carried out using the gray-tone mask GMK, and thus a resist RES with a taper is obtained. By etching the insulating layer PAS1 and the insulating layer PAS2 using such resist RES, it is possible to obtain a contact holes CH1$p$ with a low tapered end portion. In this manner, it is possible to prevent the wiring line TL from being stepped cut and obtain a display device DSP (touch panel TP) with improved touch functionality.

In this disclosure, the wiring lines TL may as well be referred to as the first wiring lines, the wiring line T1_1 to the wiring line T1_8 (electrode TCE1) may as well be referred to as the second wiring lines, the wiring line S1_1 to the wiring line S1_16 (electrode SCE1) may as well be referred to as the third wiring lines, the wiring line T2_1 to the wiring line T2_16 (electrode TCE2) may as well be referred to as the fourth wiring lines, and the wiring line S2_1 to the wiring line S2_4 and the wiring line S2_9 to the wiring line S2_12 (electrode SCE2) may as well be referred to as the fifth wiring lines. Further, in this disclosure, the wiring line S1_$d$1 to the wiring line S1_$d$26 may as well be referred to as the sixth wiring lines.

In this disclosure, the protrusion ID may as well be referred to as the first protrusion and the protrusion OD may as well be referred to as the second protrusion. Further, in this disclosure, the insulating layer IB1 may as well be referred to as the first insulating layer, the insulating layer PAS1 as the second insulating layer, and the insulating layer PAS2 as the third insulating layer. In this disclosure, the contact hole CH1 may as well be referred to as the first contact hole and the contact hole CH2 as the second contact hole.

The second wiring lines (wiring lines T1_1 to T1_8, etc., (electrode TCE1)) and the fourth wiring lines (wiring lines T2_1 to T2_16 (electrode TCE2)) are formed in the same layer.

The third wiring lines (wiring lines S1_1 to S1_16 (electrode SCE1)), the fifth wiring lines (wiring lines S2_1 to S2_4 and wiring lines S2_9 to S2_12 (electrode SCE2)) and the sixth wiring lines (wiring lines S1_$d$1 to S1_$d$26) are formed in the same layer.

The third wiring lines, fifth wiring lines and sixth wiring lines are formed in the same layer as the source electrode SE (signal line SL) of the pixel PX, as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a base;
a display area in which a plurality of pixels are provided;
a plurality of touch electrodes which overlap the display area;
a plurality of first wiring lines connected to the plurality of touch electrodes, respectively;
a plurality of second wiring lines connected to the plurality of first wiring lines, respectively;
a plurality of third wiring lines connected to the plurality of second wiring lines, respectively;
a plurality of fourth wiring lines connected to the plurality of third wiring lines, respectively;
a plurality of fifth wiring lines connected to the plurality of fourth wiring lines, respectively; and
a plurality of fifth wiring lines connected to the plurality of fourth wiring lines, respectively; wherein
the plurality of second wiring lines are each partially exposed,
the exposed regions of the plurality of second wiring lines constitute connecting portions with a wiring substrate,
half of the plurality of fourth wiring lines and all of the plurality of fifth wiring lines extend to an end portion of the base.

2. The display device according to claim 1, wherein
the plurality of the second wiring lines and the plurality of the fourth wiring lines are formed in a same layer, and
the plurality of the third wiring lines and the plurality of the fifth wiring lines are formed in a same layer.

3. The display device according to claim 1, wherein
the plurality of first wiring lines overlap a first protrusion,
the plurality of third wiring lines overlap a second protrusion, and
the plurality of second wiring lines are provided between the first protrusion and the second protrusion.

4. The display device according to claim 1, further comprising:
a first insulating layer on each of the plurality of second wiring lines;
a second insulating layer on the first insulating layer;
a third insulating layer on the second insulating layer;
the plurality of first wiring lines on the third insulating layer;
a first contact hole formed in the second insulating layer and the third insulating layer; and
a second contact hole formed in the first insulating layer, wherein
the plurality of first wiring lines are connected to the plurality of second wiring lines respectively via the first contact hole and the second contact hole,
the second insulating layer and the third insulating layer are formed of an inorganic insulating material, and
the first contact hole is formed by subjecting the inorganic insulating material to gray-tone processing.

5. The display device according to claim 1, wherein
each of the plurality of pixels includes a light emitting layer constituted by an organic electroluminescent material.

6. The display device according to claim 1, further comprising:

a plurality of sixth wiring lines connected to the plurality of pixels, respectively, wherein part of the plurality of sixth wiring lines overlaps part of the plurality of first wiring lines in plan view, and the plurality of sixth wiring lines are formed in a same layer as that of the plurality of third wiring lines.

7. A substrate comprising a plurality of individual elements, the plurality of individual elements each comprising:

a display area in which a plurality of pixels are provided, a plurality of touch electrodes which overlap the display area; and a plurality of wiring lines connected to the plurality of touch electrodes, respectively, wherein the plurality of wiring lines are each partially exposed, the exposed regions of the plurality of wiring lines constitute connecting portions with a wiring substrate, the substrate further comprises a plurality of inspection pads connected to the plurality of wiring lines, cutting lines are set between the plurality of inspection pads and the connecting portions, and the plurality of individual elements are each cut out at the cutting lines to form a display device.

8. The substrate according to claim 7, wherein the plurality of wiring lines comprise:

a plurality of first wiring lines;

a plurality of second wiring lines connected to the plurality of first wiring lines, respectively;

a plurality of third wiring lines connected to the plurality of second wiring lines, respectively;

a plurality of fourth wiring lines connected to the plurality of third wiring lines, respectively;

a plurality of fifth wiring lines connected to the plurality of fourth wiring lines; and a plurality of electrodes connected to the plurality of fifth wiring lines, respectively, wherein the plurality of second wiring lines, the plurality of fourth wiring lines and the plurality of electrodes are formed in a same layer, and

the plurality of third wiring lines and the plurality of fifth wiring lines are formed in a same layer.

9. The substrate according to claim 8, wherein the exposed regions are exposed regions of the fourth wiring lines, and the plurality of electrodes constitute a plurality of inspection pads.

10. The substrate according to claim 8, wherein the plurality of first wiring lines overlap a first protrusion, the plurality of third wiring lines overlap a second protrusion, and the plurality of second wiring lines are provided between the first protrusion and the second protrusion.

11. The substrate according to claim 8, further comprising:

a first insulating layer on each of the plurality of second wiring lines;

a second insulating layer on the first insulating layer;

a third insulating layer on the second insulating layer;

each of the plurality of first wiring lines on the third insulating layer;

a first contact hole formed in the second insulating layer and the third insulating layer; and a second contact hole formed in the first insulating layer, wherein the plurality of first wiring lines are connected to the plurality of second wiring lines respectively via the first contact hole and the second contact hole, the second insulating layer and the third insulating layer are formed of an inorganic insulating material, and the first contact hole is formed by subjecting the inorganic insulating material to gray-tone processing.

12. The substrate according to claim 7, wherein each of the plurality of pixels includes a light emitting layer constituted by an organic electroluminescent material.

13. The substrate according to claim 8, further comprising:

a plurality of sixth wiring lines connected to the plurality of pixels, respectively, part of the plurality of sixth wiring lines overlaps part of the plurality of first wiring lines in plan view, and the plurality of sixth wiring lines are formed in a same layer as that of the plurality of third wiring lines.

* * * * *